(12) United States Patent  
Gogna et al.

(10) Patent No.: US 9,000,417 B1  
(45) Date of Patent: Apr. 7, 2015

(54) RANDOM ACCESS MEMORY CELLS USING SPATIAL WAVEFUNCTION SWITCHED FIELD-EFFECT TRANSISTORS

(71) Applicant: Faquir Chand Jain, Storrs, CT (US)

(72) Inventors: Pawan Gogna, Clinton, MA (US); Faquir Chand Jain, Storrs, CT (US); John Chandy, Storrs, CT (US); Evan Heller, Glastonbury, CT (US)

( * ) Notice: Subject to any disclaimer, the term of this patent is extended or adjusted under 35 U.S.C. 154(b) by 0 days.

(21) Appl. No.: 13/960,237

(22) Filed: Aug. 6, 2013

Related U.S. Application Data

(60) Provisional application No. 61/680,001, filed on Aug. 6, 2012.

(51) Int. Cl.

| | | |
|---|---|---|
| H01L 27/092 | (2006.01) | |
| H01L 29/78 | (2006.01) | |
| H01L 27/11 | (2006.01) | |
| H01L 27/108 | (2006.01) | |
| H01L 29/10 | (2006.01) | |
| H01L 29/15 | (2006.01) | |
| H01L 29/205 | (2006.01) | |

(52) U.S. Cl.  
CPC .......... *H01L 27/1108* (2013.01); *H01L 27/108* (2013.01); *H01L 29/1033* (2013.01); *H01L 29/151* (2013.01); *H01L 29/205* (2013.01)

(58) Field of Classification Search  
CPC ................... H01L 27/11521; H01L 29/0843; H01L 29/122  
USPC ...................................................... 257/20, 24  
See application file for complete search history.

(56) References Cited

U.S. PATENT DOCUMENTS 8,294,137 B2 * 10/2012 Jain et al. ..................... 257/24

* cited by examiner

*Primary Examiner* — Whitney T Moore  
(74) *Attorney, Agent, or Firm* — Steven M. McHugh

(57) ABSTRACT

Multi-source/drain Spatial Wavefunction Switched (SWS) field-effect transistors (FETs) are configured to serve as 1-bit and 2-bit static random access memory (SRAM) and dynamic random access memory (DRAM) cells. The SWS-FET transport channel comprises of multiple asymmetric coupled wells which are contacted via more than one sources and drains.

6 Claims, 27 Drawing Sheets

Fig. 2(b) A SWS-FET having two quantum well channels.

A 4-channel SWS FET with Ge wells and -ZnSe-ZnMgSSe (II-VI) barriers sstructure showing 4 sources and 4 drains.

Figure 7(a) shows the cross-sectional schematic of an InGaAs (well) and AlInGaAs (barrier) system realized on an InP substrate. Here we show 4 distinct sources and one drain.

Quad Inversion logic for SRAM using SWSFET

Binary Inversion logic for SRAM using CMOS.

Circuit for binary to quaternary signal conversion

Quaternary to Binary conversion circuit.

Circuit schematic of SWS-FET based 1-bit SRAM

Topology of two SWS-FETs, having two more quantum well channels, configured as 1-bit SRAM cell Schematic of SWS-FETs based 1-bit SRAM cell 2-bit SRAM cell using 4-channel SWS-FET Figure 14 shows a SWSFET based 1-transistor, single-bit SRAM memory cell.

A two-bit 1-T 2-channel SWS-FET DRAM cell using two capacitors

The topology of the FET and two capacitors.

System design using SWSFET based memory with other process blocks

US 9,000,417 B1

RANDOM ACCESS MEMORY CELLS USING SPATIAL WAVEFUNCTION SWITCHED FIELD-EFFECT TRANSISTORS

CROSS REFERENCE TO RELATED APPLICATIONS

This application claims the benefit of priority to filing date of U.S. Provisional Patent Application No. 61/680,001 filed Aug. 6, 2012, and is related to U.S. Pat. No. 8,294,137 (Oct. 23, 2012) and U.S. patent application Ser. No. 12/006,974, filed Jan. 9, 2008, the contents of all of which are incorporated herein by reference in their entireties.

STATEMENT REGARDING FEDERALLY SPONSORED RESEARCH

The United States Government has certain rights in this invention pursuant to National Science Foundation Grant No. ECS-0622068 and Office of Naval Research Contract No. N00014-06-1-0016.

FIELD OF THE INVENTION

The disclosure relates generally to Field Effect Transistors (FETs) and MOS devices and more particularly to static random access memory (SRAM) and dynamic random access memory (DRAM) using spatial wavefunction switched (SWS) Field Effect Transistors (FETs). This also relates to quaternary logic and multi-valued logic.

BACKGROUND OF THE INVENTION

Conventional Field-Effect Transistors (FETs) comprise one transport channel, which is generally induced as an inversion layer by the application of a gate voltage above a threshold value. It has one source and one drain. Although a FET may have one or more gates, typically there is only one top gate which is formed above the transport channel having an appropriate thin gate insulator layer. Additionally, Field-Effect Transistors (FETs) having a back gate have also been reported. Moreover, there are also FIN-FETs where the gate region surrounds the semiconductor body between the source and drain regions. All of these structures have the common characteristic that there is one inversion channel which is connected to one drain and one source. Conventional FETs are well known to realize static random access memory SRAM cells using two cross-coupled inverters (each inverter having two transistors either in n-MOS or CMOS configurations) with two access transistors. In addition, dynamic random access memory (DRAM) cells are realized using conventional FETs using one-transistor (1-T) and one storage capacitor. This 1-T DRAM cell is widely used. However, these conventional FET based memories only process 1-bit at one stage.

SUMMARY OF THE INVENTION

A 2-bit SRAM cell consists of two back-to-back connected 4-channel SWS-FETs, where each SWS-FET serves as quaternary inverter. This architecture results in reduction of FET count by 75% and data interconnect density by 50%. In addition, the binary interface logic and conversion circuitry are designed to integrate the SWS-SRAM technology. Quantum simulations for Si/Ge and InGaAs-based SWSFETs are also presented. Design and structure of DRAM cells storing 2 bits using SWS-FETs are presented. Quaternary logic is also described.

SWS-FETs are configured to host electrons in multiple quantum well channels (W1 the uppermost to W4 the lowest most in a 4-channel device) when the gate is biased above a first threshold level. At higher gate voltages the electrons are transferred to upper quantum wells at their respective thresholds. As the electrons transfer from one quantum well to the other, the current conduction in the emptied channel becomes smaller and eventually vanishes. Each channel could be connected at the source and drain ends individually or collectively depending on the application. In a 4-state or 2-bit SWS-FET there are four distinct sources S1-S4. These sources can be connected to four different voltage levels. When the FET device has a common drain, this SWS-FET behaves as a quaternary inverter. Two such inverters, connected back to back behave as a 2-bit static random access (SRAM) cell. The access transistors in such a SRAM cell provide access to bitline and bitline-bar. A SWS-FET transistor, having two quantum well channels, is shown to serve as an access transistor in a 1-bit dynamic random access memory (DRAM) cell which connects two storage capacitors to each of the two channels. 1-SWSFET SRAM cell storing 1-bit are also described. Quaternary logic block and adders and half-adders can be implemented using SWS-FETs. Moreover, a high level compact microprocessor, using SWS-FET based SRAM array, DRAM array and multi-valued logic blocks, can be implemented.

BRIEF DESCRIPTION OF THE DRAWINGS

The foregoing and other features and advantages of the present invention will be more fully understood from the following detailed description of illustrative embodiments, taken in conjunction with the accompanying figures in which like elements are numbered alike:

FIG. 2 (c) shows the electrons being primarily in the upper well W1 as the gate voltage is raised above threshold but greater than that of FIG. 2b.

DETAILED DESCRIPTION OF THE INVENTION

Multi-source/drain Spatial Wavefunction Switched (SWS) field-effect transistors (FETs) are configured to serve as 1-bit and 2-bit static random access memory (SRAM) and dynamic random access memory (DRAM) cells. The SWS-FET transport channel comprises of multiple asymmetric coupled wells which are contacted via more than one sources and drains.

Figure 1A:
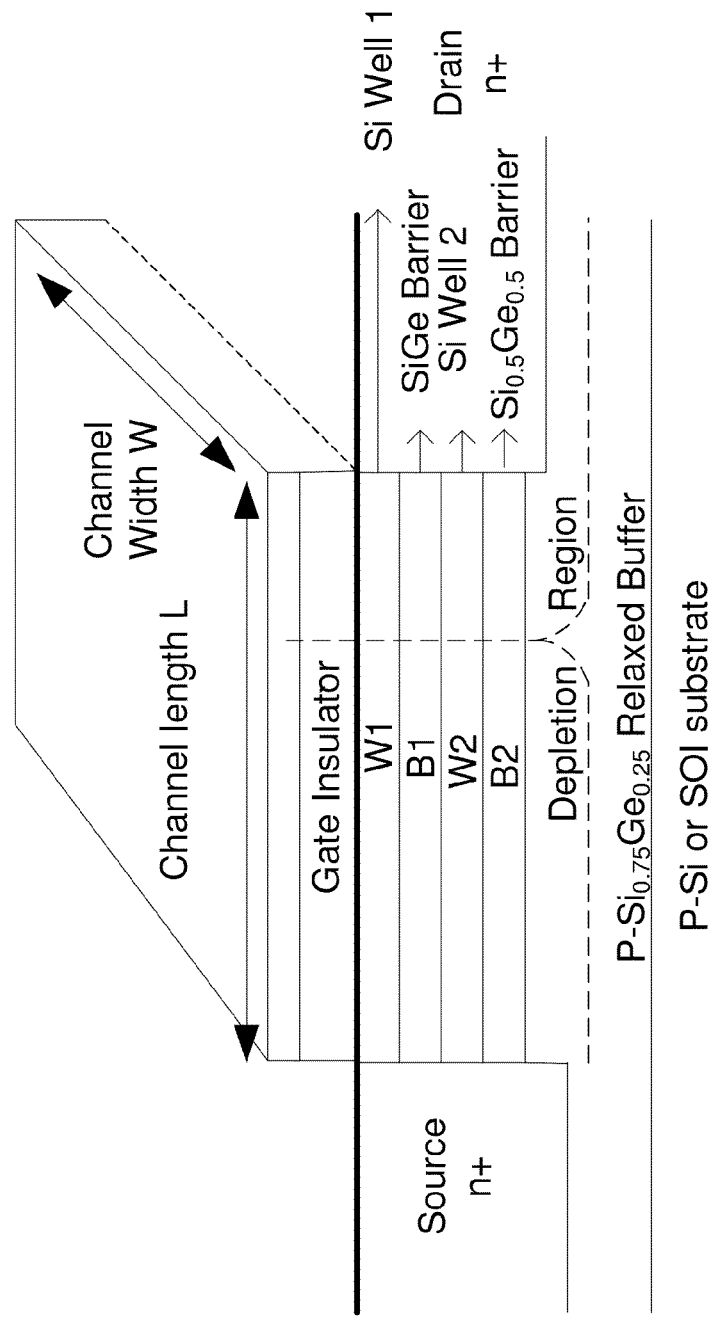
FIG. 1(a) shows the cross-sectional schematic of a Si SWS-FET having two quantum well transport channel.

Asymmetric coupled quantum well (ACQW) structures (as shown in FIG. 1a) describes the transport channel (or also know as inversion channel) of the FET, which confines carriers in either the lower of the two wells (W2 in proximity to the substrate), both wells, and/or upper well (W1 proximity to the gate insulator). As the gate voltage is increased in n-channel devices, the carrier wavefunction changes which shifts the charge location. This device is referred to as spatial wavefunction switched (SWS) FET. It should be appreciated that a Spatial Wavefunction Switched (SWS) FET (having two coupled well channel) provides four states 00, 01, 10, 11 corresponding to the wavefunction being OFF (00), in well W2 (01), in both wells W2-W1 (10), and in Well 1 (11). Moreover, depending on application, four states 00, 01, 10, 11 corresponding to the wavefunction locations being OFF (00), in well W2 (01), in both wells W2-W1 (11), and in Well 1 (10).

Figure 1B:
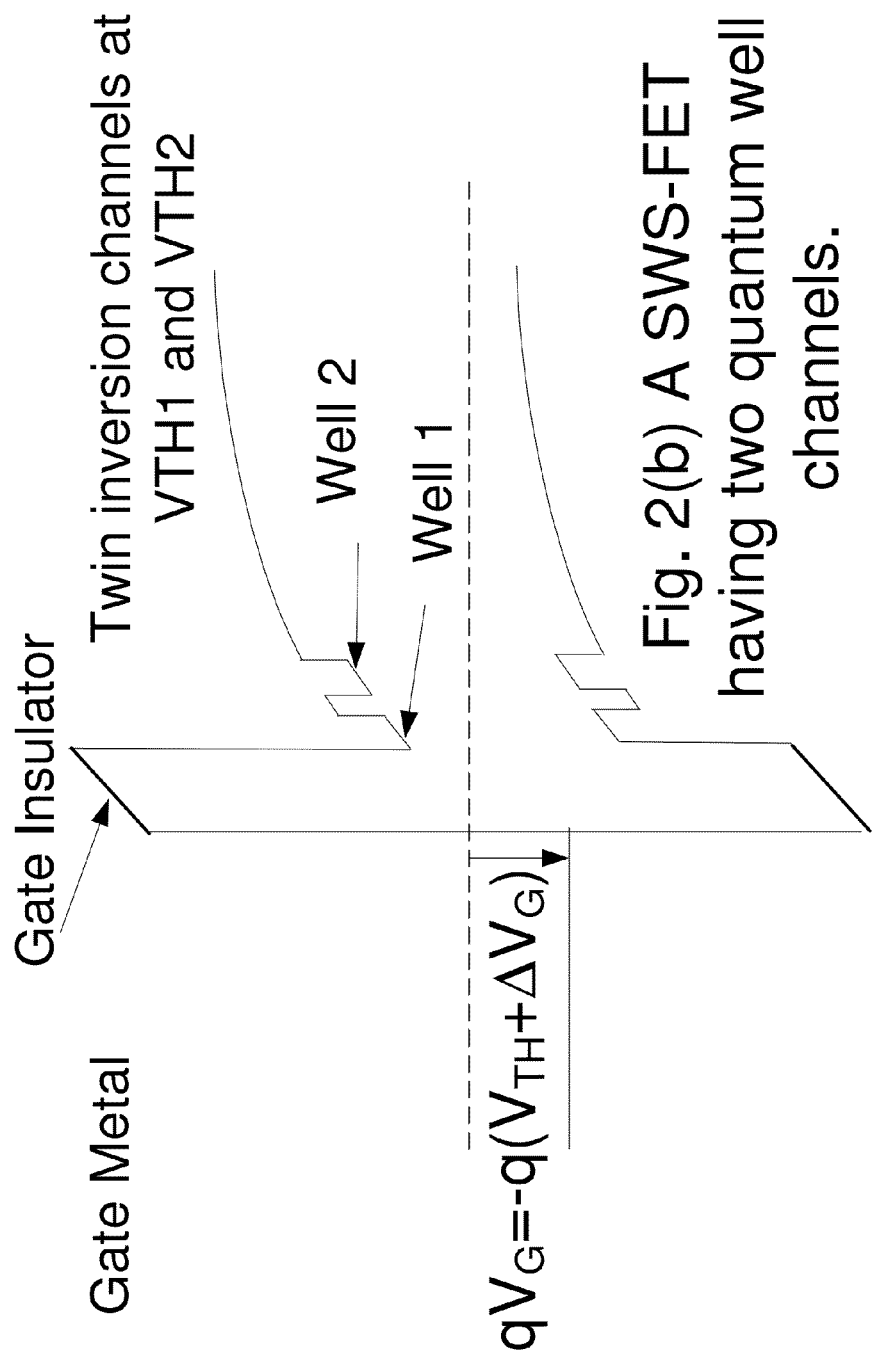
FIG. 1b shows schematically the energy bands of a coupled well 2-channel SWS-FET having two wells W2 (lower) and W1 (upper).

FIG. 1(b) shows a SWS-FET schematically in terms of energy band diagram showing conduction and valence bands.

Figure 1C:
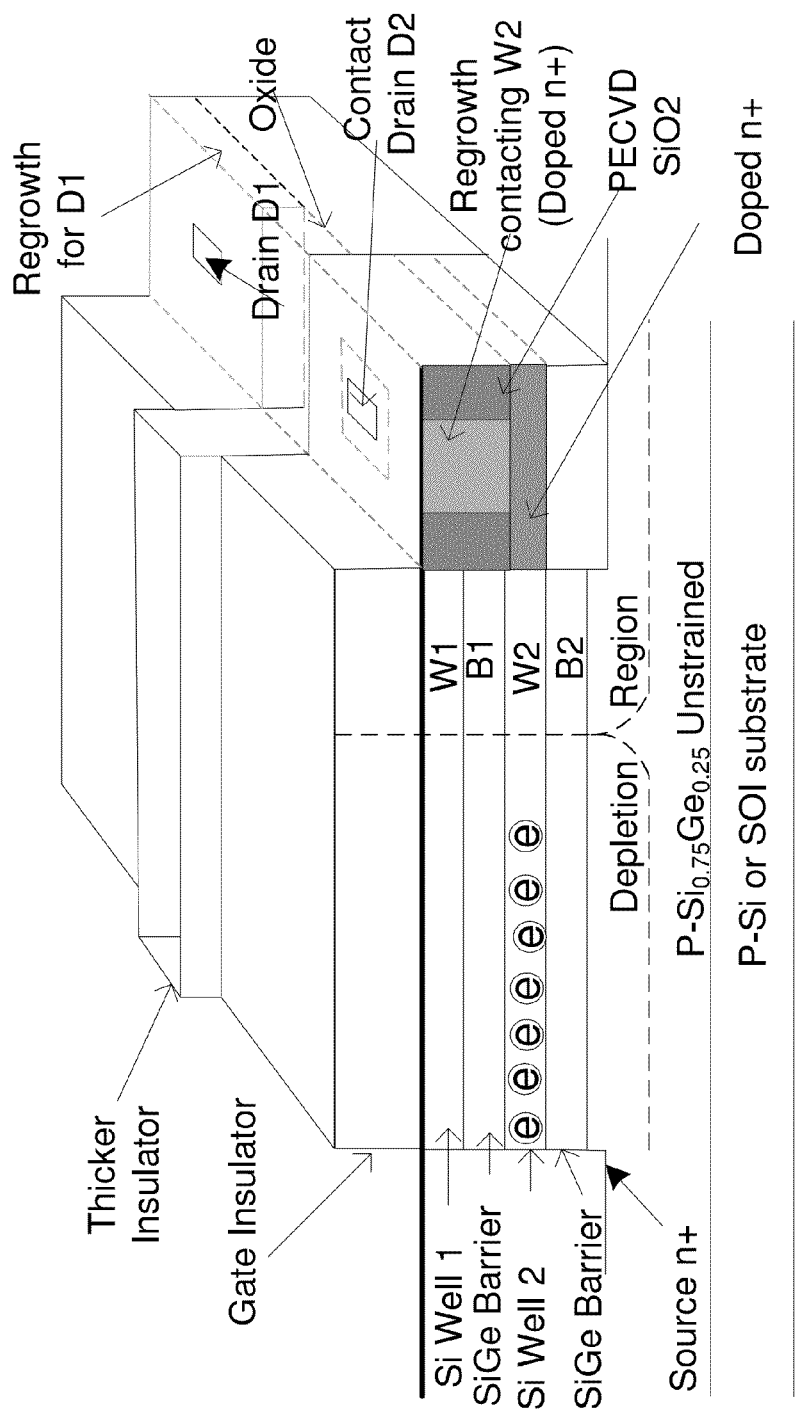
FIG. 1c shows a 3-Dimensional view of 2-channel SWS-FET showing two separate drains, one source and one gate.

Referring to FIG. 1(c), a three-dimensional schematic block diagram of a Si based SWS-FET comprising of twin drains is illustrated. The twin drains D1, D2 are shown explicitly. It should be appreciated that the twin drains may be realized using any method suitable to the desired end purpose, such as by etching and re-growth (in one embodiment). For example, one embodiment may include etching of the drain region to the depth of Si Well W2 and re-growth of n+ doped $_{Si}$ layer, and subsequently depositing SiO$_2$ layer by Plasma Enhanced Chemical Vapor Deposition (PECVD), etching to expose the n+ doped Si layer and depositing contact layer (or re-growing doped region and contacting). The contact region may connect to lower Si quantum well W2 to form Drain D2. Similarly, drain contact D1 may be formed by using an insulating SiO2 region. The gate insulator is also shown, while the gate contact layer is not shown. Here, a thick insulator layer is also shown and may be uniform for one single SWS-FET.

Figure 2A:
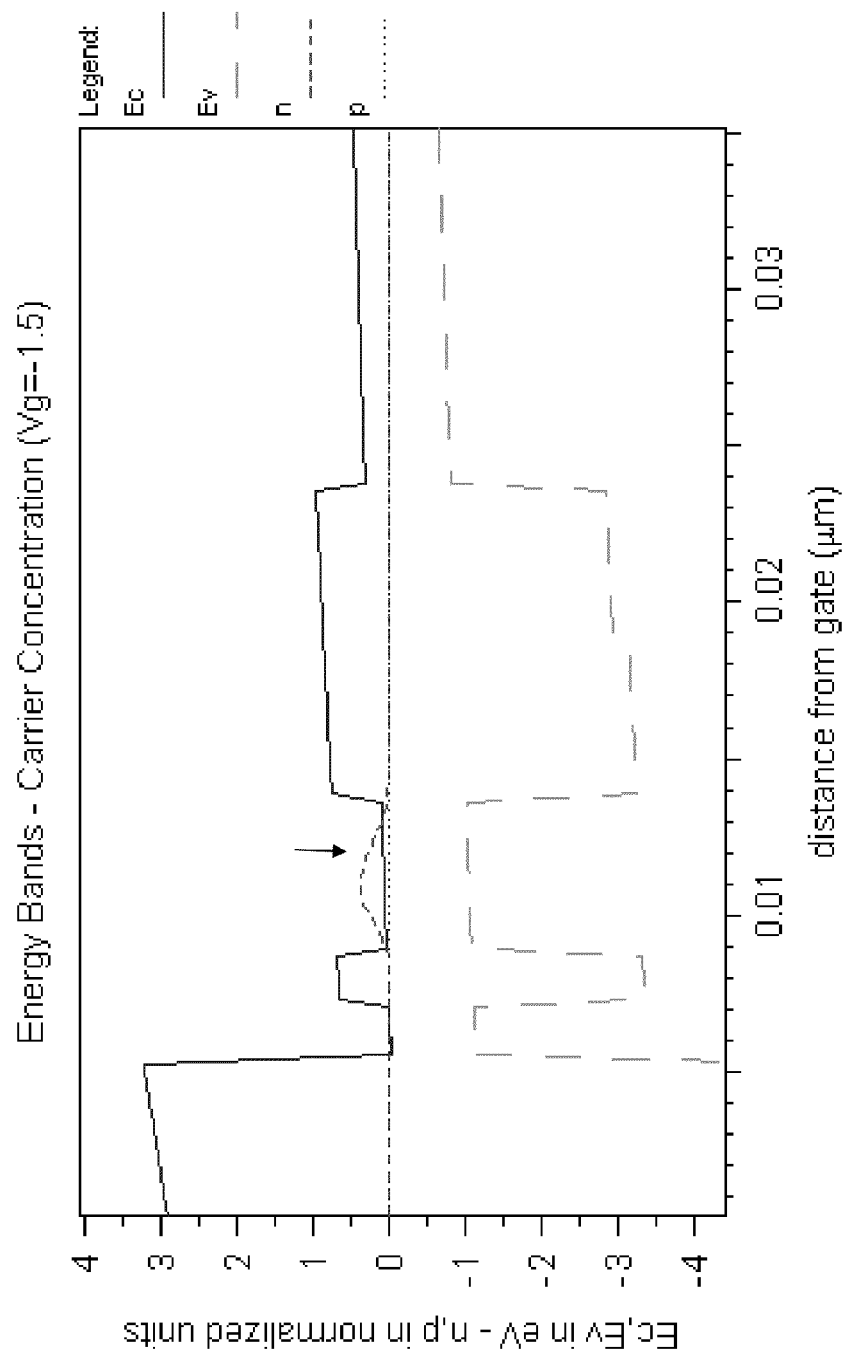
FIG. 2 (a) shows carriers in Si Well #W2 as the gate voltage is raised above threshold.
FIG. 2(b) shows the electrons being in the both lower well W2 as well as in upper well W1 as the gate voltage is further raised above threshold.
Figure 2B:
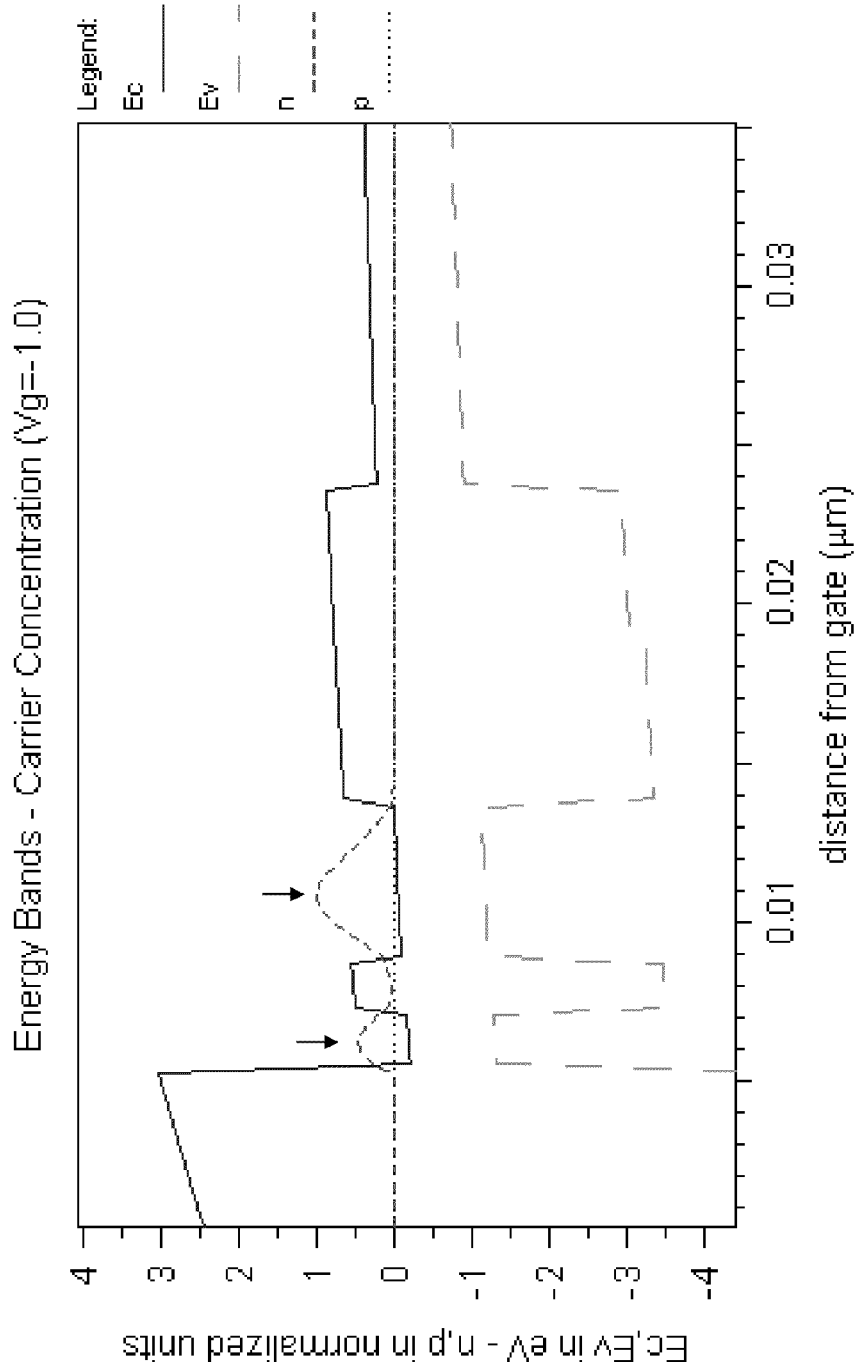
Figure 2C:
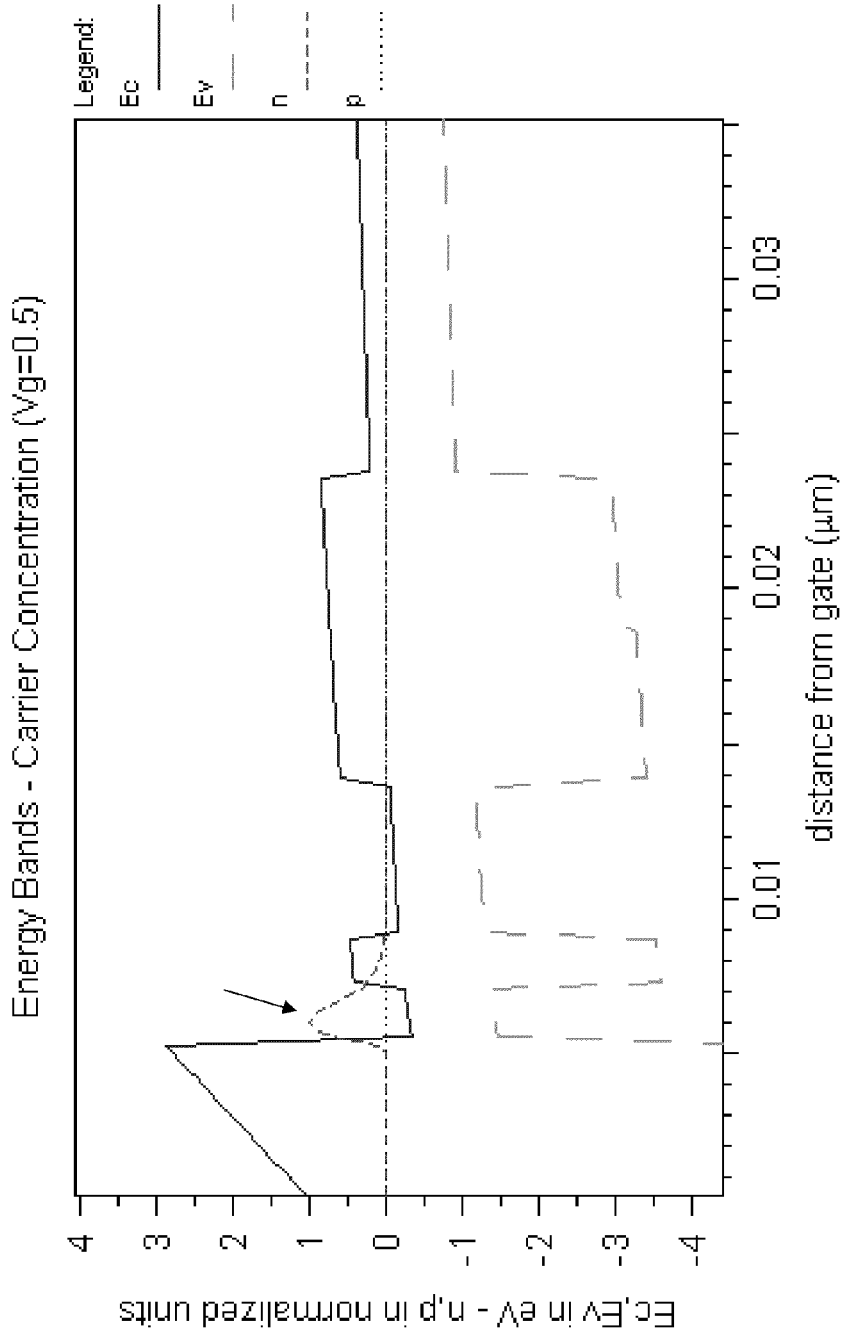

Referring to FIG. 2(a), carriers in the lower Si quantum well W2 are shown when the gate voltage is just above the threshold value. In this case a value of 40 Angstrom for the SiO$_2$ gate insulator is used. However, other values may be used as desired and suitable to the end result. It should be appreciated that the carrier concentration is the summation of probability ($\phi^*\phi$)) over all of the allowed states populated by carriers in the conduction band (for n-channel devices). It should also be appreciated that Wavefunction ($\phi$) may be obtained by self-consistently solving the Schrodinger and Poisson's equations. FIG. 2(b) shows the electrons being in the both lower well W2 as well as in upper well W1 as the gate voltage is further raised above threshold. Referring to FIG. 2(c) carriers primarily switched to the upper Si quantum well W1 shown as the gate voltage is increased, where the gate voltage is shown as being significantly above the threshold value.

Figure 3:
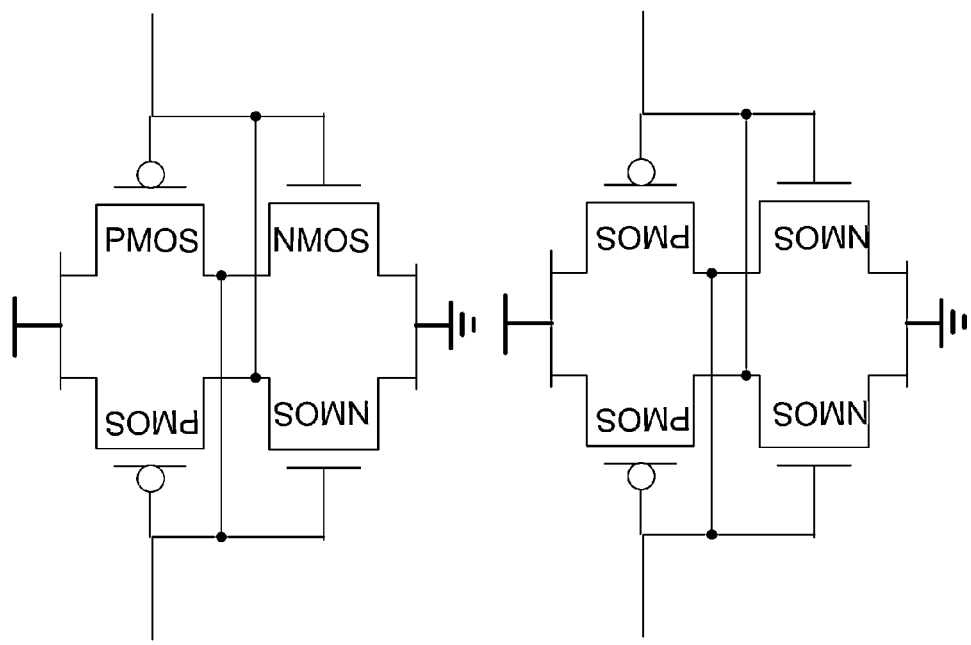
FIG. 3 shows conventional two 1-bit static random access memory (SRAM) cells.

FIG. 3 shows conventional two 1-bit static random access memory (SRAM) cells. Here, the access transistors are not shown. This is well known in the literature.

Figure 4:
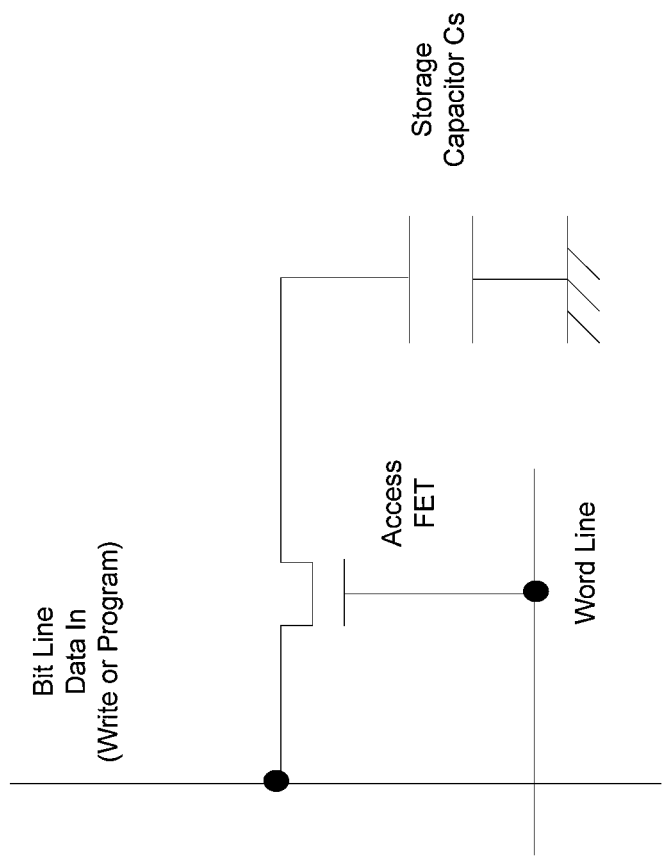
FIG. 4 shows a conventional 1-transistor dynamic random access memory (DRAM) cell.

FIG. 4 shows a conventional 1-transistor dynamic random access memory (DRAM) cell. There are many variations in which the storage capacitors are implemented, as known in the literature.

Figure 5:
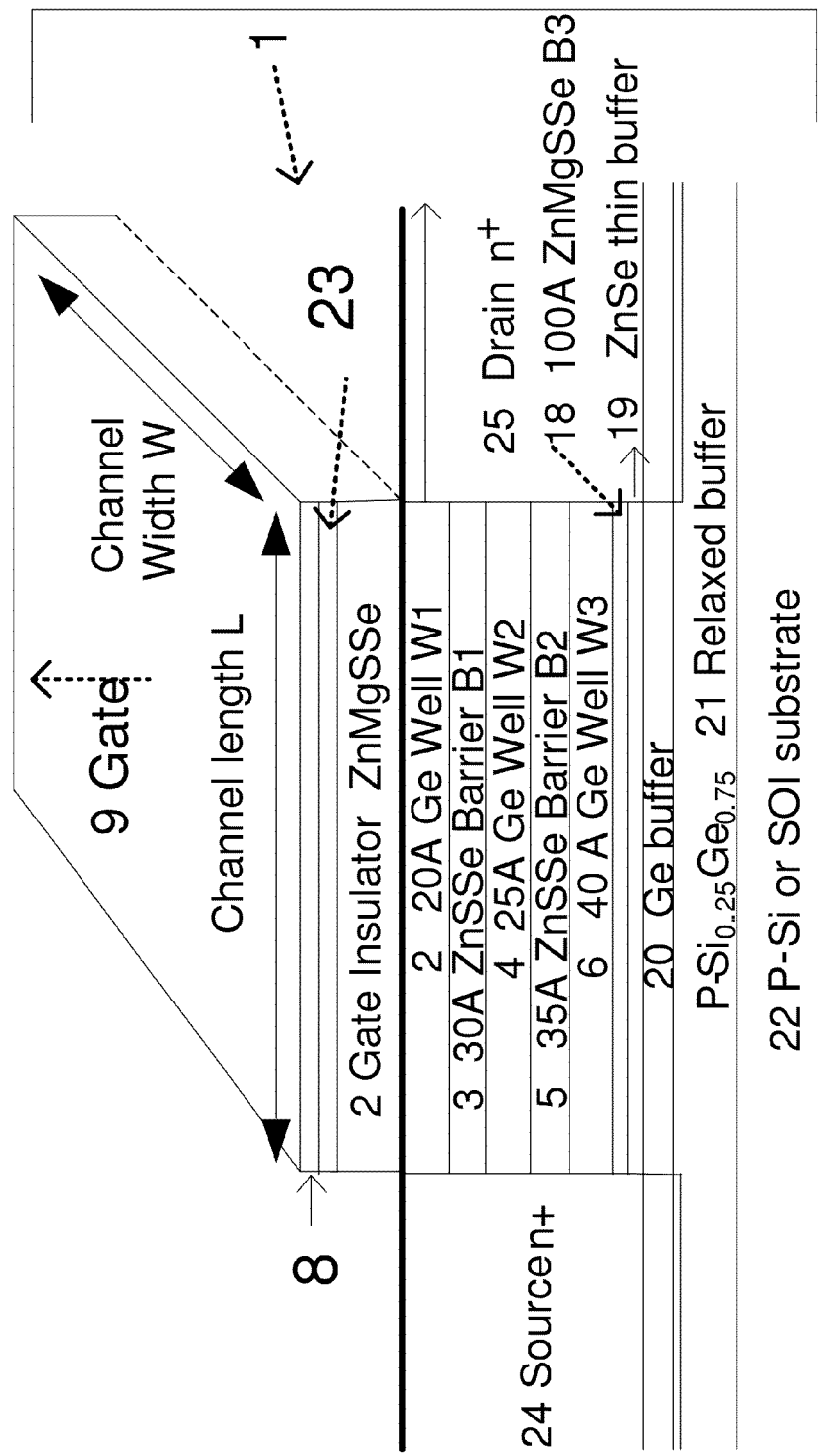
FIG. 5 shows a 3 Ge well SWS FET with II-VI barriers.

FIG. 5 shows a 3 coupled Ge quantum well SWS-FET 1 comprising of II-VI (ZnSSe) barriers. The germanium well W1 2 is sandwiched between the gate insulator layer 10 and barrier B1 3, the germanium well W2 4 is between B1 3 and barrier B2 5. Germanium well W3 6 is between barrier B2 5 and barrier B3 18. Barrier 18 is deposited on ZnSe buffer layer 19 which in turn is deposited in one embodiment on Ge buffer layer 20. In one embodiment, there is a SiGe relaxed buffer layer 21 which is deposited on Si substrate 22. Deposited on gate insulator 10 is gate material 23 which is selected from poly Si, poly Ge, metal. In the case of poly Si, there is an additional layer 8 which functions as the interconnect connecting other devices. This is also forms the gate 35.

| Layer | Thick(um) | χ(eV) | E$_g$(eV) | m$_e$ | m$_h$ | ε$_r$ | N$_d$ | N$_a$ |
|---|---|---|---|---|---|---|---|---|
| ZnMgSSe | 0.0050 | 0.90 | 4.50 | 0.13 | 0.38 | 8.0 | 0.0e00 | 0.0e00 |
| Ge QW1 | 0.0014 | 4.1 | 0.67 | 0.082 | 0.28 | 16 | 0.0e00 | 1.0e13 |
| ZnMgSSe Bar | 0.0026 | 3.5 | 4.50 | 0.13 | 0.38 | 8.0 | 0.0e00 | 1.0e15 |
| Ge QW2 | 0.0015 | 4.11** | 0.67 | 0.082 | 0.28 | 16 | 0.0e00 | 1.0e13 |
| ZnMgSSe Bar | 0.0030 | 3.5 | 4.50 | 0.13 | 0.38 | 8.0 | 0.0e00 | 1.0e15 |
| Ge QW3 | 0.0025 | 4.12** | 0.67 | 0.082 | 0.28 | 16 | 0.0e00 | 1.0e13 |
| ZnMgSse Bar | 0.0025 | 3.5 | 4.50 | 0.13 | 0.38 | 8.0 | 0.0e00 | 1.0e15 |

-continued

| Layer | Thick(um) | χ(eV) | $E_g$(eV) | $m_e$ | $m_h$ | $\epsilon_r$ | $N_d$ | $N_a$ |
|---|---|---|---|---|---|---|---|---|
| Ge QW4 | 0.0030 | 4.13** | 0.67 | 0.082 | 0.28 | 16 | 0.0e00 | 1.0e13 |
| ZnMgSse Bar | 0.0200 | 3.5 | 4.50 | 0.13 | 0.38 | 8.0 | 0.0e00 | 1.0e15 |
| ZnSe Bar | 0.1000 | 4.0 | 2.67 | 0.13 | 0.38 | 8.0 | 0.0e00 | 1.0e15 |
| SiGe buffer | 0.4000 | 3.9 | 0.89 | 0.19 | 0.49 | 11.9 | 0.0e00 | 1.0e16 |
| Si* substrate | 1.0 | 4.15 | 1.12 | 0.19 | 0.49 | 11.9 | 0.0e00 | 1.0e16 |

In one embodiment 3 Si wells and 3 SiGe barriers, like FIG. 1a, could be used.

Figure 6:
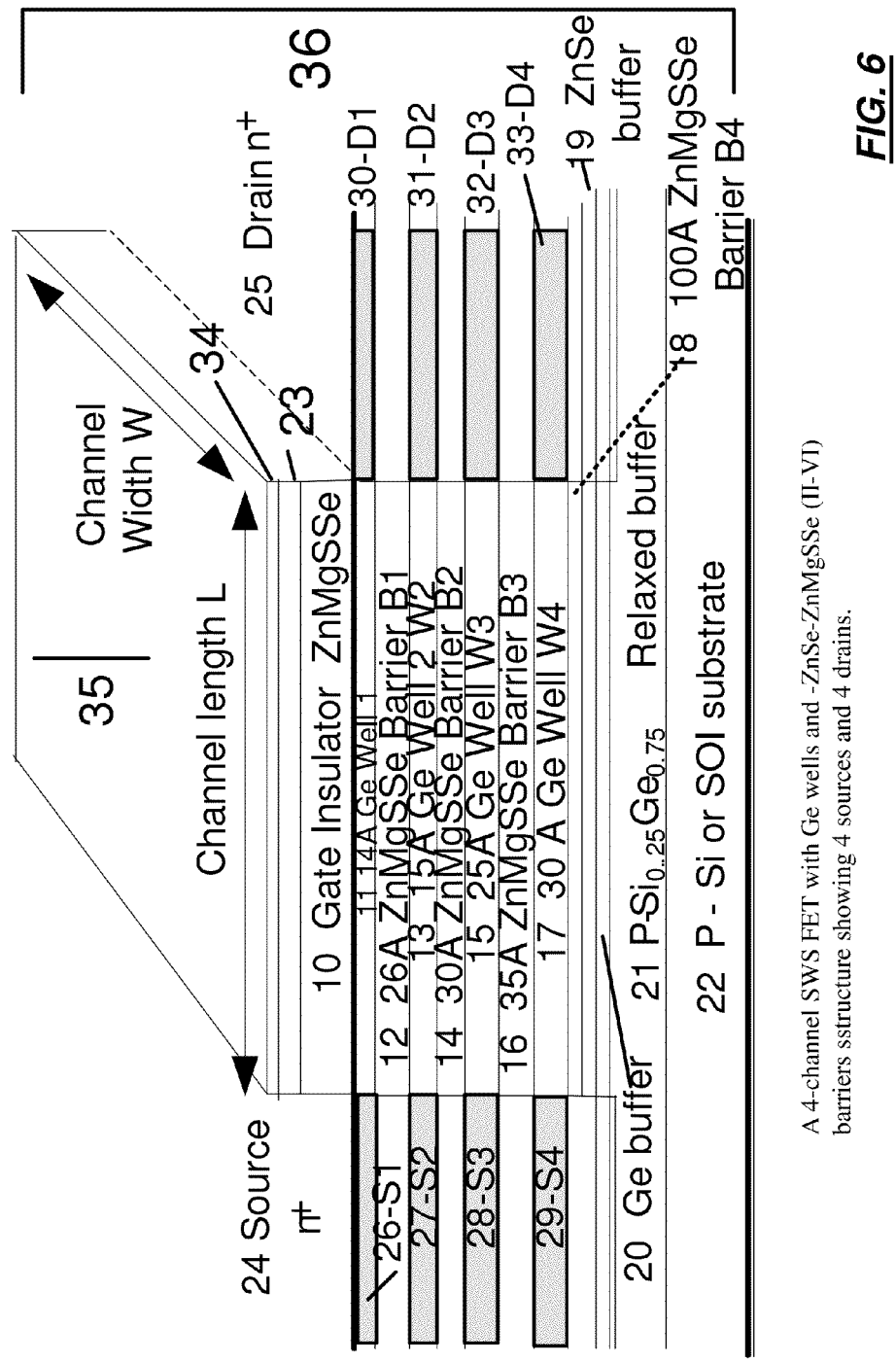
FIG. 6 A 4-quantum channel SWS FET with Ge wells and ZnSe—ZnMgSSe (II-VI) barriers structure showing 4 sources and 4 drains.

FIG. 6 A 4-quantum channel SWS-FET 36 with Ge wells and ZnMgSSE (II-VI) barriers structure showing 4 sources and 4 drains. The germanium well W1 11 is sandwiched between the gate insulator layer 10 and barrier B1 12, the germanium well W2 13 is between B1 12 and barrier B2 14. Germanium well W3 15 is between barrier B2 14 and barrier B3 16, and Ge well W4 17 is sandwiched between barrier B3 16 and barrier B4 18. Barrier 18 is deposited on ZnSe buffer layer 19 which in turn is deposited in one embodiment on Ge buffer layer 20. In one embodiment, there is a SiGe relaxed buffer layer 21 which is deposited on Si substrate 22. The substrate in one embodiment is silicon-on-insulator. Deposited on gate insulator 10 is gate material 23 which is selected from poly Si, poly Ge, metal. In the case of poly Si, there is an additional layer (34) which functions as the interconnect connecting other devices. The gate is 35. The Ge wells are contacted by source 24 and drain 25 regions. Here, four source contacts to each well are shown. W1 11 is connected to source S1 26, W2 13 is connected to S2 27, W3 14 is connected to S3 28 and W4 17 is connected to S4 29. On the drain side 25, the wells are connected to D1 30, D2 31, D3 32, and D4 33. Deposited on gate insulator 10 is gate material 23 which is selected from poly Si, poly Ge, metal. In the case of poly Si or Ge or other semiconductors, there is an additional layer 8 which functions as the interconnect connecting other devices. This is also forms the gate 35. Table above shows parameters used in simulation in one embodiment of 4-well SWS-FET structure with Ge wells.

In one embodiment barriers separating the Ge quantum wells is ZnBeMgSe, ZnSSe, and other layers providing the desired stains in the wells and in the entire structure.

Figure 7A:
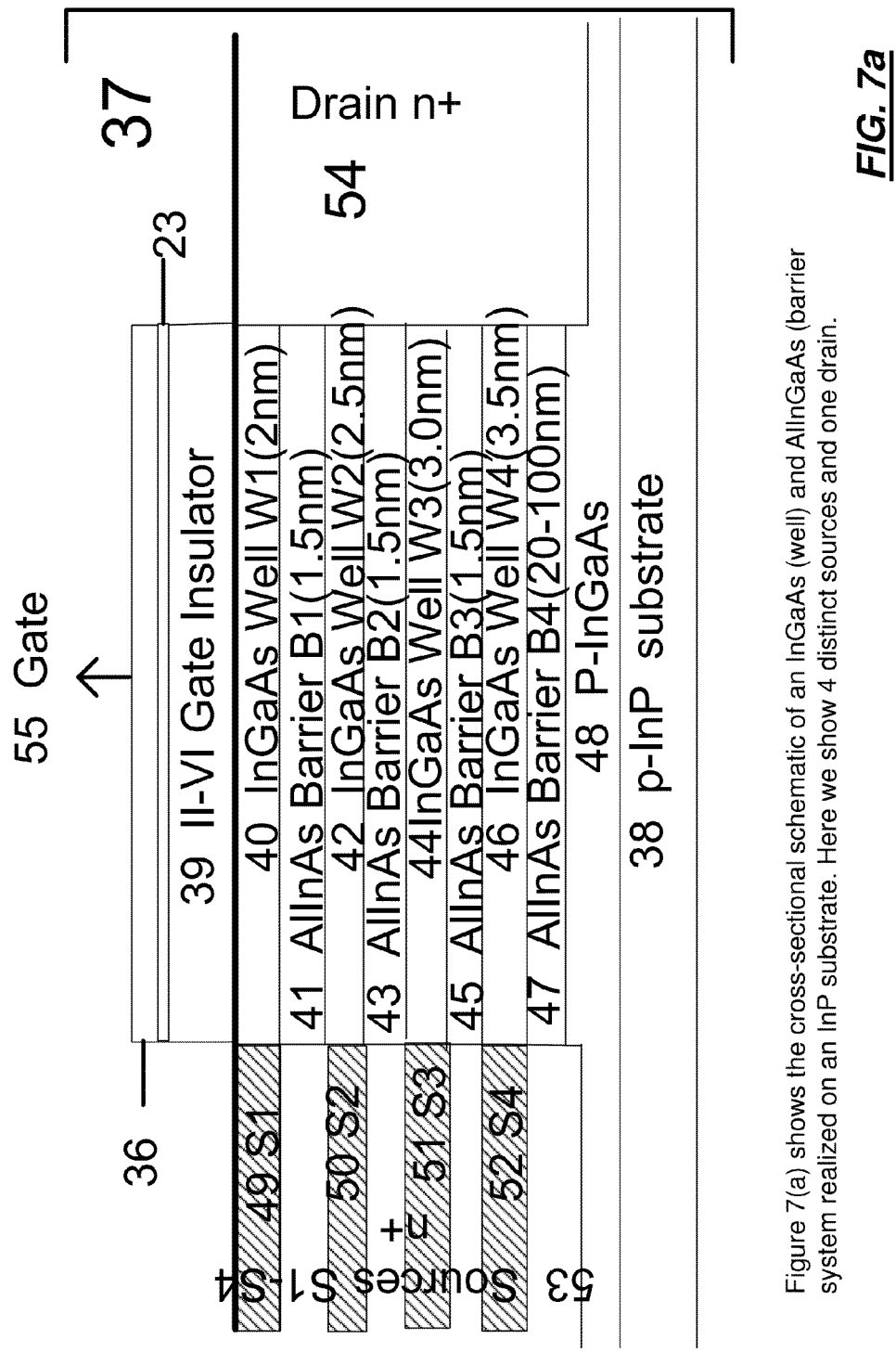
FIG. 7(a) shows the cross-sectional schematic of an InGaAs (well) and AlInGaAs (barrier system realized on an InP substrate. Here we show 4 distinct sources and one drain.

FIG. 7(a) shows the cross-sectional schematic of an InGaAs (well) and AlInGaAs (barrier) system based SWS-FET 37 realized on an InP substrate 38. Here we show 4 distinct sources and one drain. The InGaAs well W1 40 is sandwiched between the gate insulator layer 39 and AlInAs barrier B1 41, the InGaAs well W2 42 is between AlInAs B1 41 and AlInAs barrier B2 43. InGaAs well W3 44 is between AlInAs barrier B2 43 and AlInAs barrier B3 45, and InGaAs well W4 46 is sandwiched between barrier B3 45 and AlInAs barrier B4 47. Barrier 47 is deposited on p-inGaAs buffer layer 48 which in turn is deposited on p-InP substrate 38. The InGaAs wells are contacted by source region 53 and drain region 54. Here, four source contacts to each well are shown. W1 40 is connected to source S1 49, W2 42 is connected to S2 50, W3 44 is connected to S3 51 and W4 46 is connected to S4 52. On the drain side 54, the wells are connected to common drain. Deposited on gate insulator 39 is gate material 23 which is selected from poly Si, poly Ge, metal. In the case of poly Si or Ge or other semiconductors, there is an additional layer 36 which functions as the interconnect connecting other devices. This is also forms the gate 55.

In another embodiment, the drains are connected to four drains separately. This type of SWS-FET is used as 2-bit inverter in the realization of SRAM cell of FIG. 12.

Figure 7B:
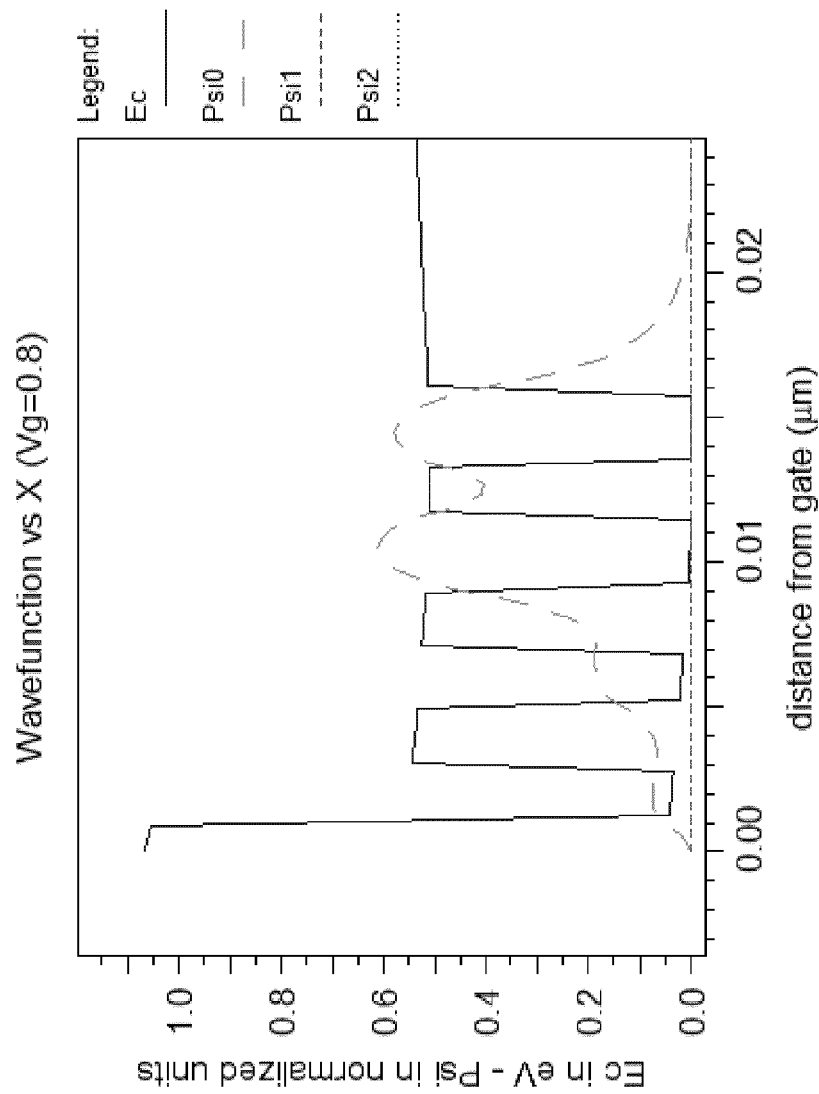
FIG. 7(b) shows the simulation of wavefunction locations in W4 and W3 when a gate voltage applied.

FIG. 7(b) shows the simulation of wavefunction locations in W4 and W3 when a gate voltage applied above threshold.

Figure 7C:
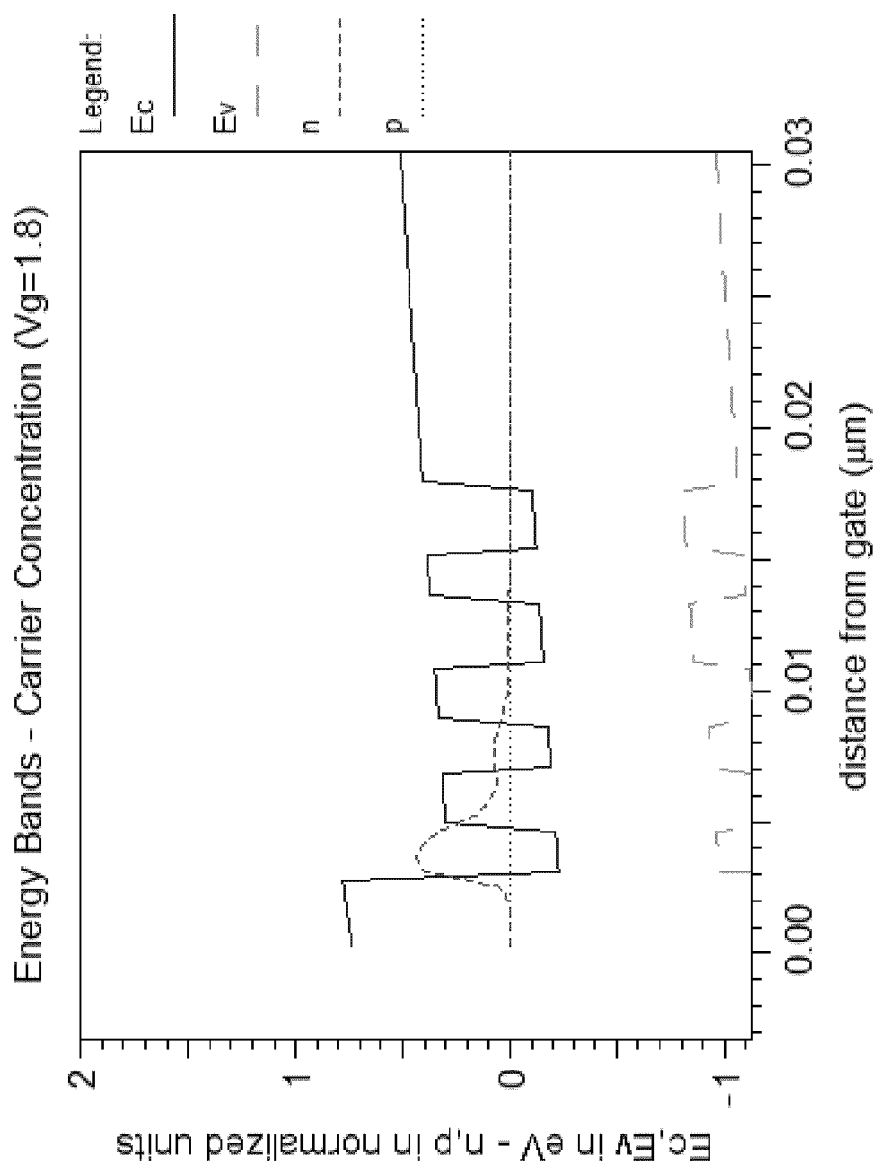
FIG. 7(c) shows carriers primarily in Well W1 for a given gate voltage. Here, a different values of barrier height of gate insulator and barrier separating quantum wells.

FIG. 7(c) shows carriers primarily in Well W1 for a given gate voltage. Here, a different value of barrier height of gate insulator and barrier separating quantum wells are used in simulations.

Figure 7D:
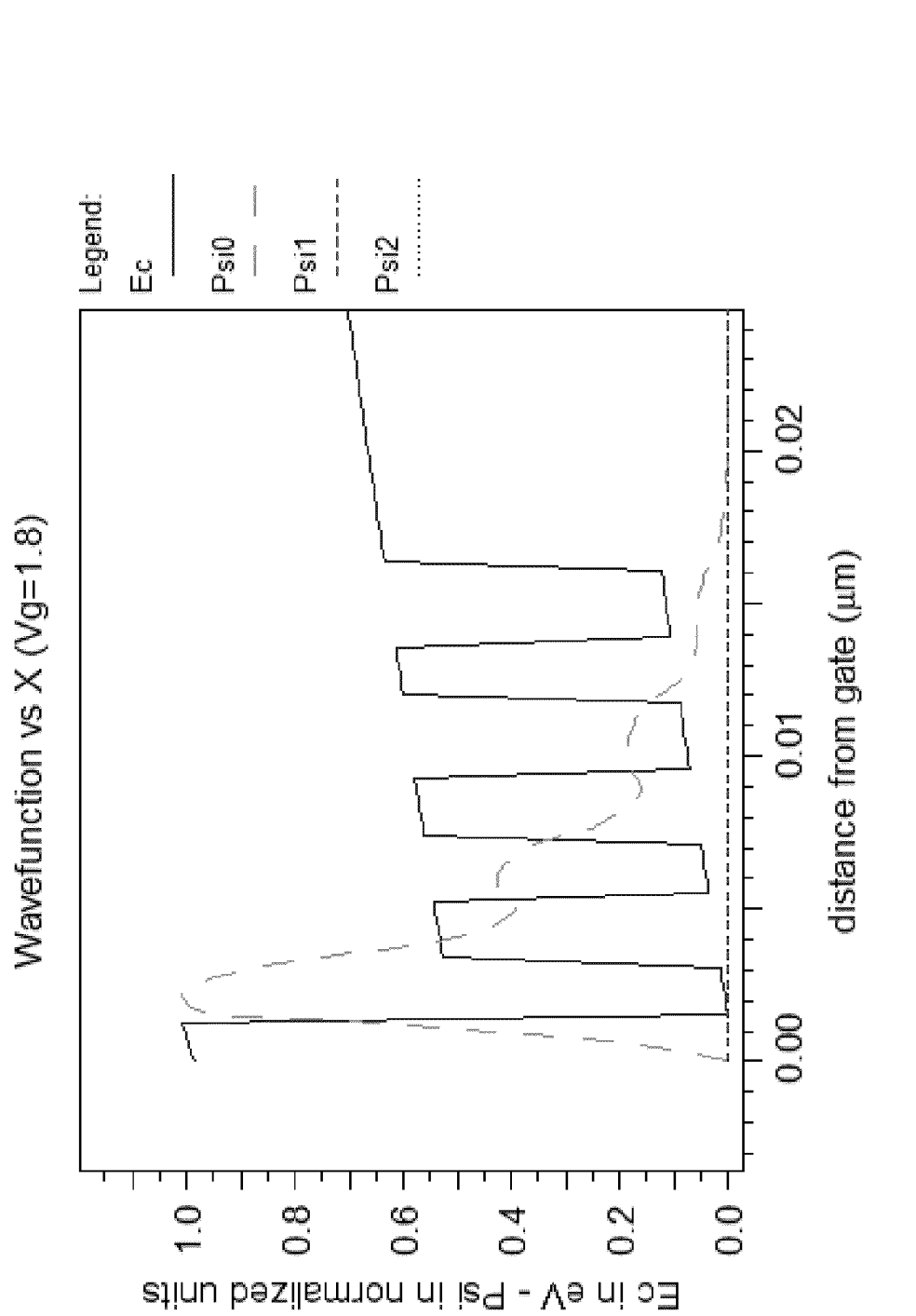
FIG. 7(d) Wavefunction in well W1 with barrier heights of gate insulator and barriers separating the quantum wells are similar to that of FIG. 7b.

FIG. 7(d) Wavefunction in well W1. The barrier heights and gate insulators are similar to FIG. 7b.

Figure 8B:
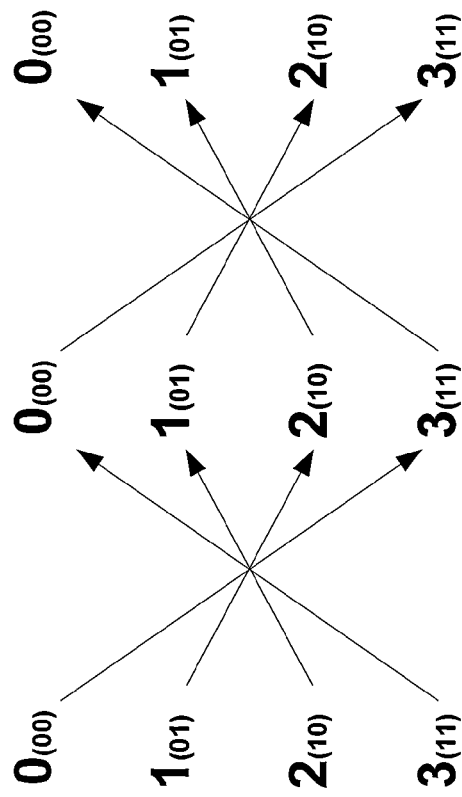
FIG. 8b is the quaternary logic for SRAM using SWS-FETS.
Figure 8A:
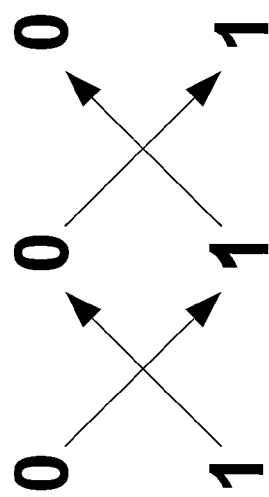
FIG. 8a is the schematic representation of binary inversion logic.

FIG. 8a is the schematic representation of conventional binary inversion logic. Two inversions are shown. First state '0' is inverted to '1' and subsequently it is converted to state '0' by the second inverter stage. This is generic and is valid for CMOS or NMOS based inverters.

FIG. 8b is the quaternary logic for SRAM using SWS-FETs. The quaternary logic states are identified as "0", "1", "2", and "3". Their binary counter parts are also shown. For example, quaternary "0" is shown as $0_{(01)}$ and quaternary "3" is shown as $3_{(11)}$. Here, at the first SWS-FET inverter stage, the quaternary "0" is converted to "3" (shown as $3_{(11)}$). Where in "$3_{(11)}$", "3" represents the quaternary number and "$_{(11)}$" represents the equivalent binary bits. Subsequently, "3" is transformed to "0" by the second inverter stage. Also, at the first SWS-FET inverter stage, the quaternary "0" is converted to "3" (shown as $3_{(11)}$). Subsequently, "3" is transformed to "0" by the second inverter stage.

Figure 9A:
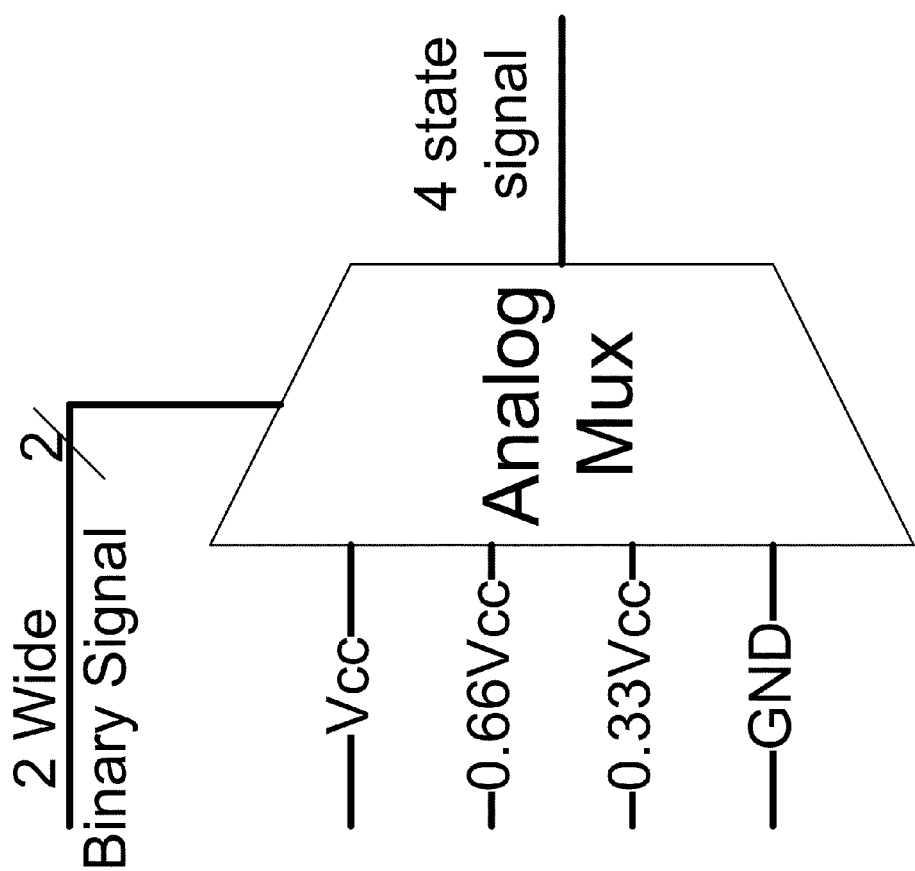
FIG. 9a Circuit for binary to quaternary signal conversion.

FIG. 9a Circuit for binary to quaternary signal conversion. FIG. 9a shows the conversion circuit designed for converting a binary signal to a quaternary signal. The design consists of an analog multiplexer (MUX) with 2 binary bit wide select line connecting to the incoming 2-bit binary signal. This 2-binary bit wide select line could have four values from the set {00,01,10,11}. Corresponding to each of these four values a particular analog input is connected to the output of the Analog MUX. The 4 input binary signals are shown as Vcc, 0.66Vcc, 0.33Vcc, and GND. The binary signal selects one of the four levels to drive the output of the analog MUX. Hence the binary signal chooses one of the four levels to be the output level and converts the binary signal to a quaternary (4-level) signal.

Figure 9B:
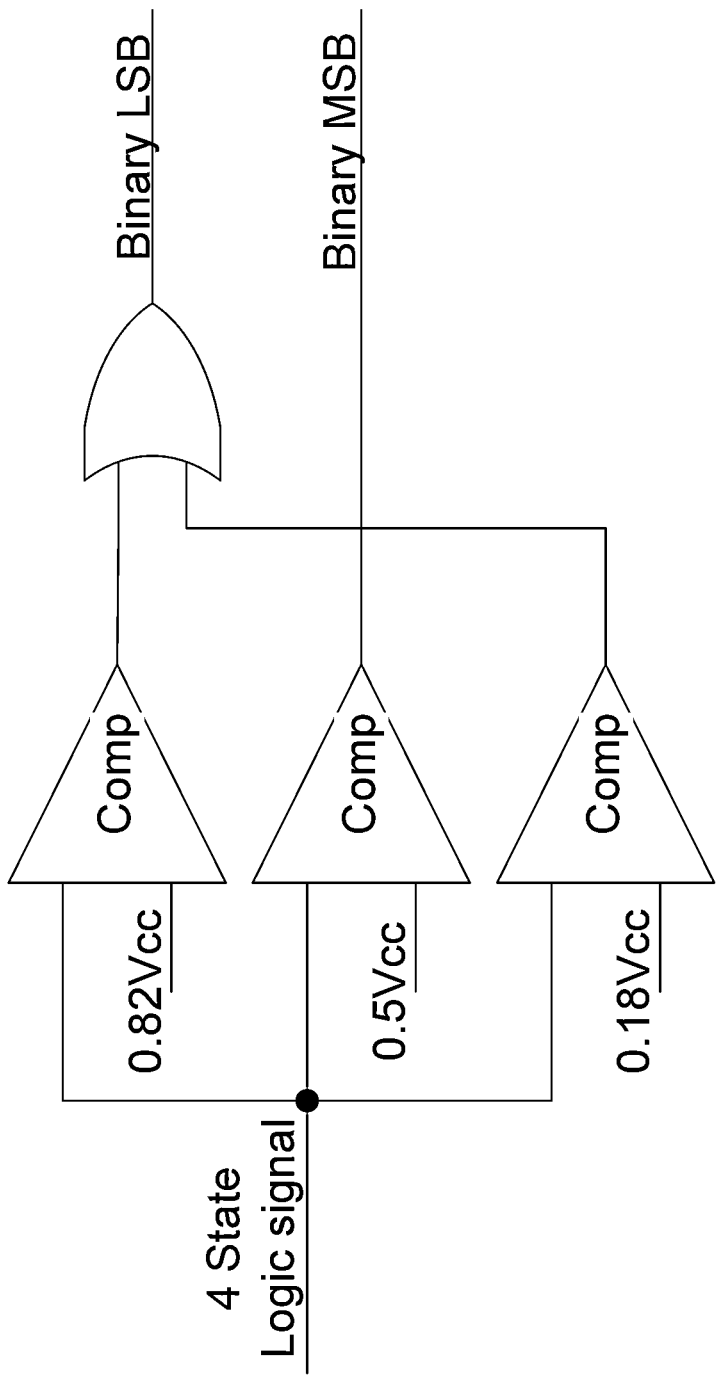
FIG. 9b Quaternary to Binary conversion circuit.

FIG. 9b gives the circuit for conversion from quaternary to binary conversion. The circuit uses three comparators (labeled as Comp) and an OR gate. The comparators compare the incoming quaternary signal level (having four levels as explained in FIG. 9a) to some reference voltage (e.g. 0.18Vcc in Comp bottom, 0.5Vcc in middle Comp, and 0.82Vcc in top Comp) and generate an compare output signal. One of these comparator signal is used as Most Significant Bit (MSB) of the 2-bit binary output. The output signals of other two comparator are fed through a OR gate, and generate the Least Significant Bit (LSB) for the conversion circuit.

Figure 10A:
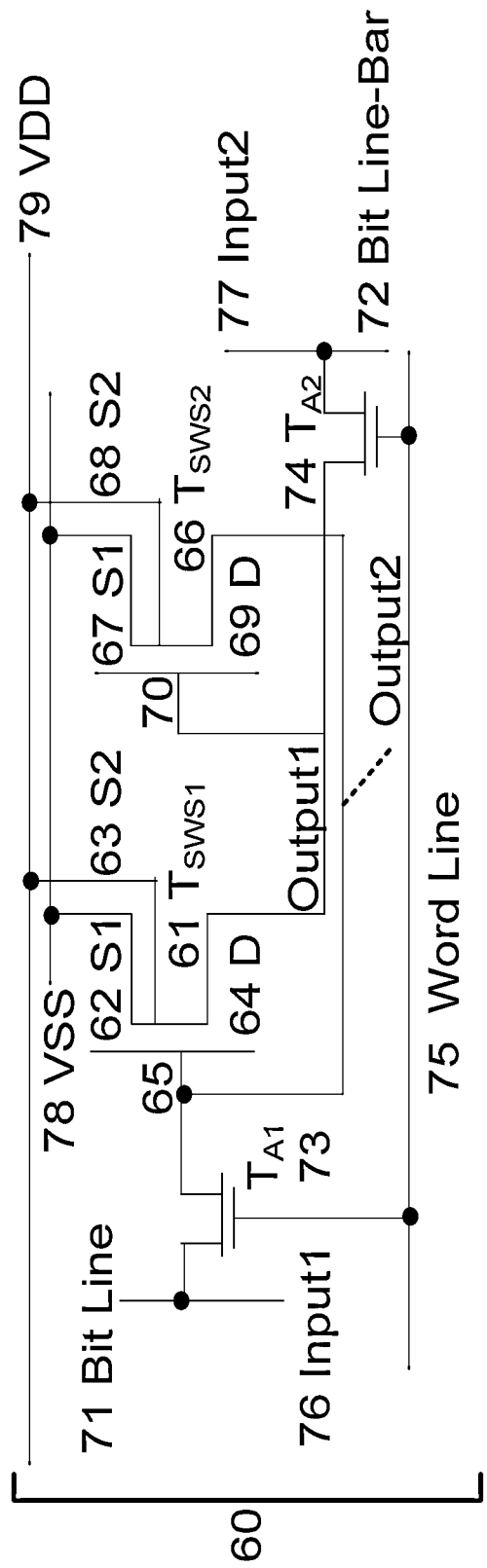
FIG. 10a Circuit schematic of SWS-FET based 1-bit SRAM.

FIG. 10a Circuit schematic of SWS-FET based 1-bit SRAM 60. It shows two SWS-FETs ($T_{SWS1}$ 61, and $T_{SWS2}$ 66), each is shown with two quantum well channels and two sources (S1 62, 67 and S2 63, 68). Each source is connected to two different voltage levels (VSS 78 and VDD 79). The two (or twin) drains in each SWS-FET are shorted together (or they have one common drain D which connects both quantum well channels). Also drain D 64 of the first SWS-FET 61 ($T_{SWS1}$) is connected to the gate 70 of the second SWS-FET 66 ($T_{SWS2}$) and the drain D 69 of the second SWS-FET 66 ($T_{SWS2}$) is connected to the gate 65 of the first SWS-FET 61 ($T_{SWS1}$). In addition, gates (65 and 70) of the two SWS-FETs (61 and 66) are connected to the data lines (bit-line 71 and bit-line bar 72) through two access transistors $T_{A1}$ 73, and $T_{A2}$ 74. These transistors are controlled by Word Line 75. The Word Line 75 acts as an enable signal for this memory cell to perform Read or Write operations. Once a cell is accessed, the Bit Line 71 provides the Input1 76. The bit-line 71 and bitline-Bar 72 are the data signals used in Read or Write operations. When the word line 75 has the appropriate voltage level, access transistors $T_{A1}$ 73 and $T_{A2}$ 74 turn ON and connect BitLine 71 and BitLine-Bar 72 to gates of $T_{sws1}$ 61 and $T_{sws2}$ 66. In Read operation the $T_{sws1}$ 61 and $T_{sws2}$ 66 transistors charge or discharge the bitline 71 and bitline-bar 72, and in Write operation the bitline 71 and bitline-bar 72 line drive the gates (65 and 70) of $T_{sws1}$ 61 and $T_{sws2}$ 66 to the levels to be programmed into the memory cell. A comparison of this SWS-FET based 1-bit SRAM 60 cell with conventional cell (FIG. 3) shows use of 2 SWS-FETs versus 4 conventional FETs. Both conventional and SWS based SRAM cell use two access transistors. In this figure, the access transistors are of single channel conventional FETs.

In one embodiment the use of SWS-FETs as access transistors is envisioned. The access transistors could be CMOS technology based NMOS, PMOS or combination of thereof. Also SWS-FET could be used as access transistor. In such embodiment each access transistor is replace by an SWSFET. In another embodiment, a single SWSFET transistor replaces the two access transistors. Effectively, two channels of a SWS-FET replace the access transistors $T_{A1}$ 73 and $T_{A2}$ 74.

Figure 10B:
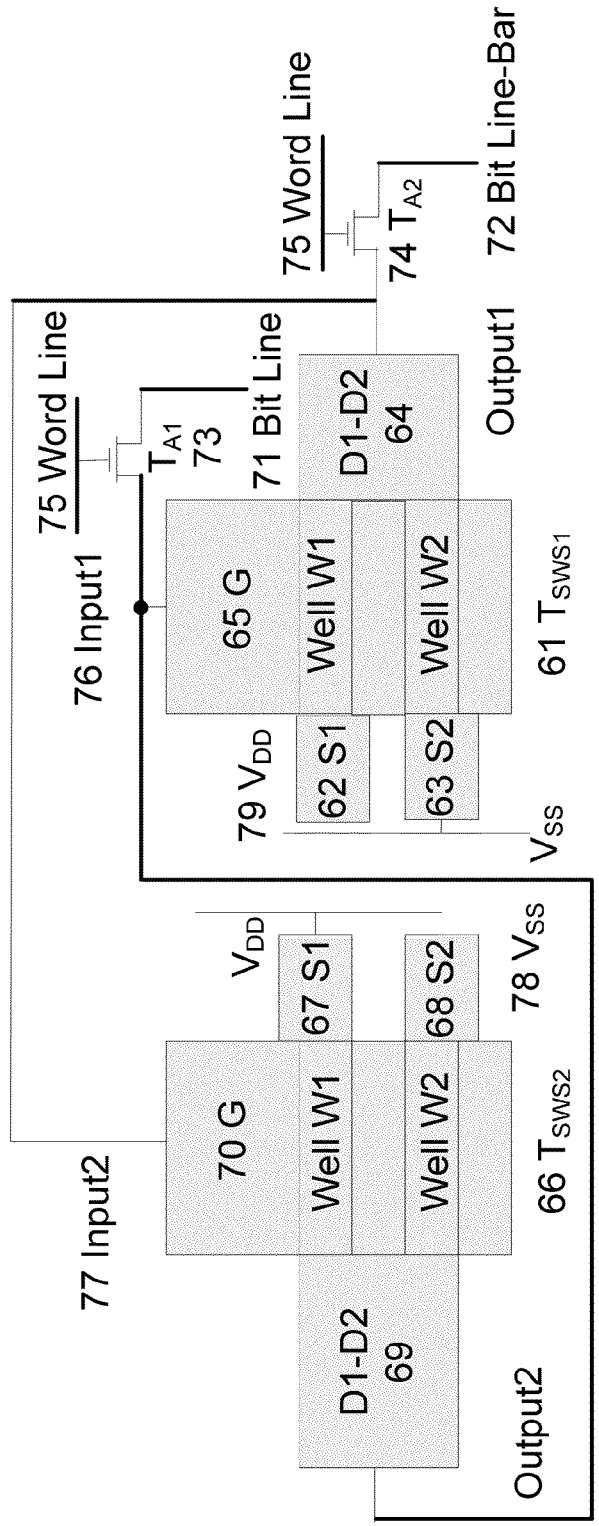
FIG. 10b Topology of two SWS-FETs, having two more quantum well channels, configured as 1-bit SRAM cell FIG. 11. Schematic of SWS-FETs based 2-bit SRAM cell.

FIG. 10b Topology of two SWS-FETs, having two quantum well (W1 and W2) channels, configured as 1-bit SRAM cell 60. It shows two SWS-FETs ($T_{sws1}$ 61 and $T_{sws2}$ 66), each with two channels and two sources (S1 62, 67 and S2 63, 68). The drains D1 and D2 in each SWS-FET are connected together (as one common drain D as in FIG. 10(a). Also drain D 64 of the first SWS-FET $T_{SWS1}$ 61 is connected to the gate of the second SWS-FET $T_{SWS2}$ 66, and the drain D 69 of the second SWS-FET $T_{SWS2}$ 66 is connected to the gate 65 of the first SWS-FET $T_{SWS1}$ 61. In addition, Input1 76 and Input2 77 in the figure are connected to the data lines through two access transistors $T_{A1}$ 73 and $T_{A2}$ 74. These transistors are turned ON or OFF by the word line 75. The word line 75 acts as an access signal for this memory cell. The bitline 71 and bitline-Bar 72 are the data signals used in Read or Write operations. The access of the bitline 71 and bitline-Bar 72 signals to $T_{sws1}$ 61 and $T_{sws2}$ 66 is through the access transistors $T_{A1}$ 73 and $T_{A2}$ 74. The control signal to turn $T_{A1}$ 73 and $T_{A2}$ 74 is "wordline". When the word line 75 has the appropriate voltage level, access transistors $T_{A1}$ 73 and $T_{A2}$ 74 turn on and connect bitLine 71 and bitLine-bar 72 to gates (65 and 70) of $T_{sws1}$ 61 and $T_{sws2}$ 66. In read operation the $T_{sws1}$ 61 and $T_{sws2}$ 66 transistors charge or discharge the bitline 71 and bitline-bar 72 and in write operation the bitline 71 and bitline-bar 72 drive the gates of $T_{sws1}$ 61 and $T_{sws2}$ 66 to the levels to be programmed into the memory cell.

In one embodiment the use of SWS-FETs as access transistors is envisioned. In FIG. 10b the access transistors could be CMOS technology based NMOS, PMOS or combination of thereof. Also SWS-FET could be used as access transistor. In such embodiment each access transistor is replace by an SWS-FET. In another embodiment, a single SWSFET transistor replaces the two access transistors. Effectively, two channels of a SWS-FET replace the access transistors $T_{A1}$ and $T_{A2}$.

Figure 11:
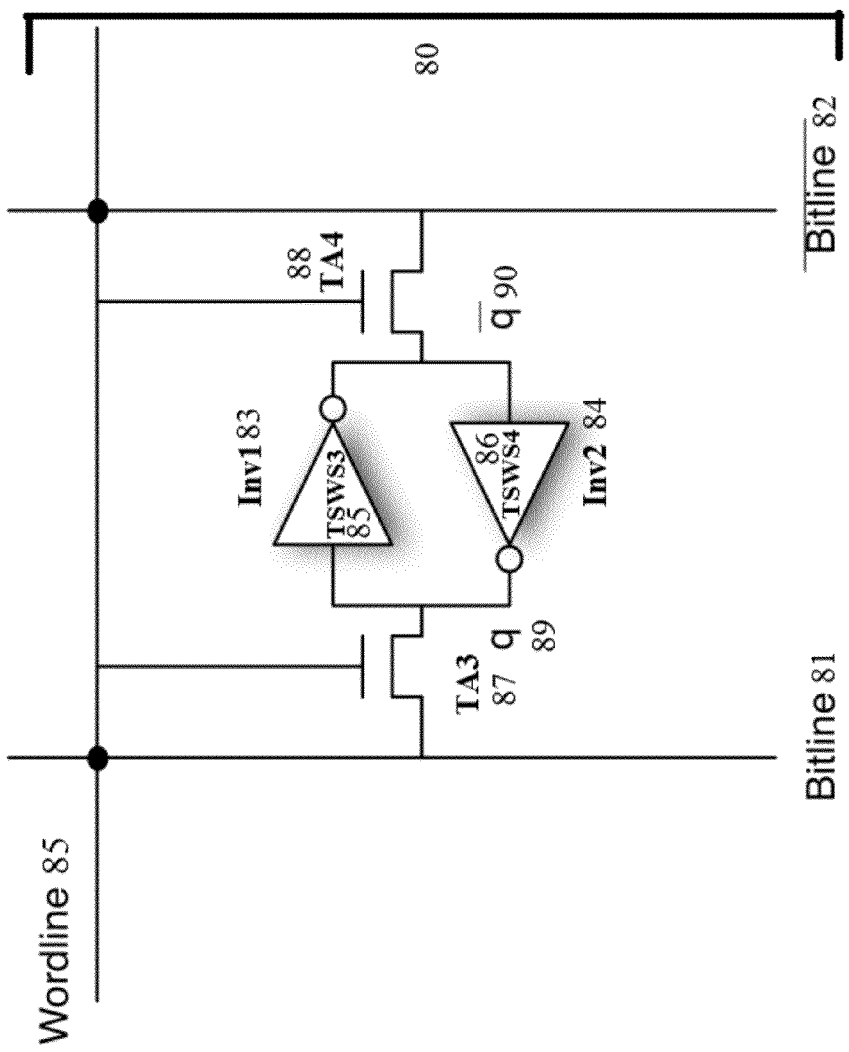
Figure 12:
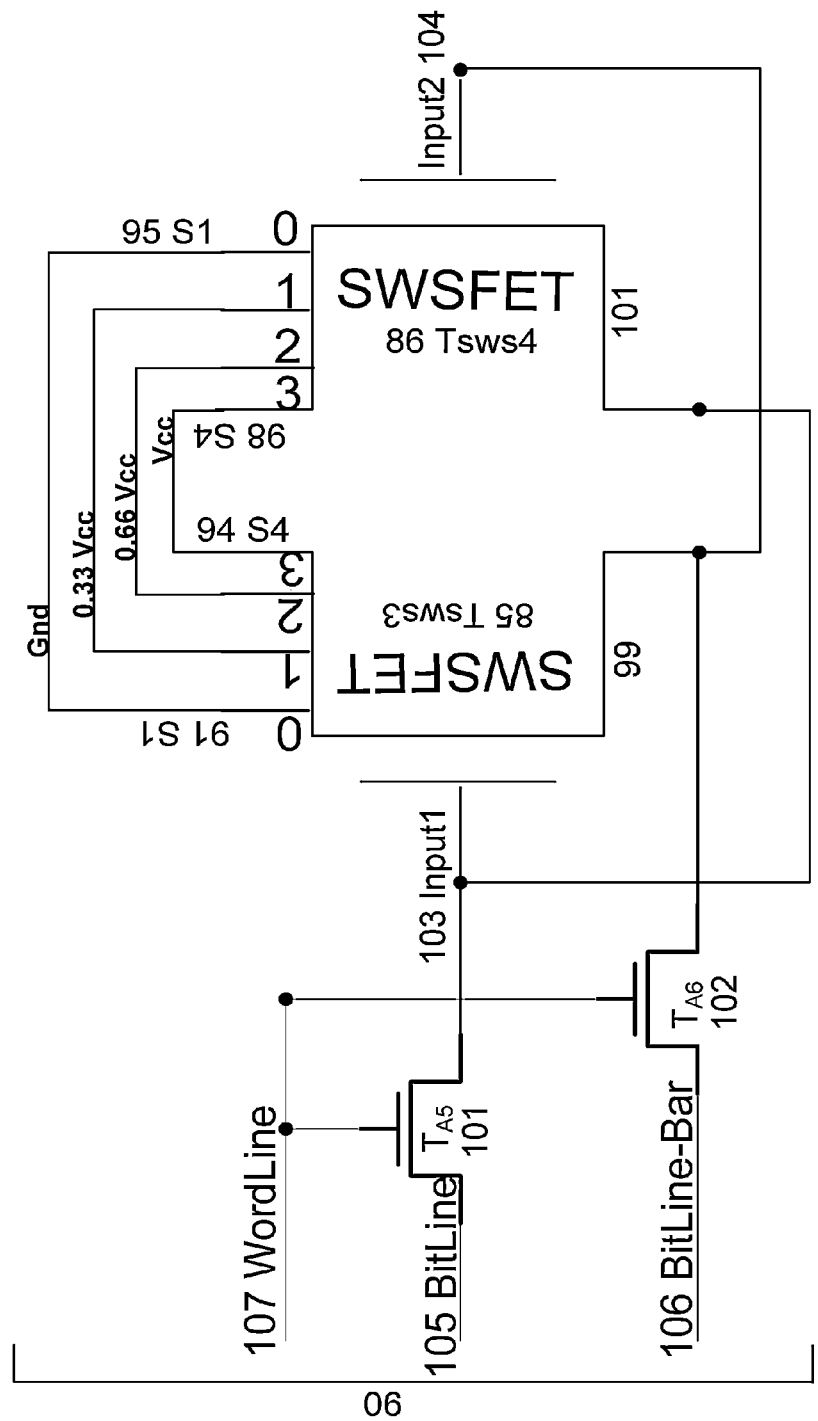
FIG. 12 Circuit schematic of a 2-bit SRAM cell using 4-channel SWS-FET.

FIG. 11. Schematic of SWS-FETs based 2-bit SRAM cell. Here the SWS-FETs serving as inverters comprise of 4- or more quantum well channel SWS-FETs (shown explicitly in FIG. 12 with 4 sources and one common drain). FIG. 11 shows data lines (Bitline 81 and Bitline-bar 82) and Read/Write access lines (Word line 85). The two inverters (INV1 83 and INV2 84) shown in the figure retains the data and act as the core of the memory cell. Two transistors shown in the figure act as access transistors $T_{A3}$ 87 and $T_{A4}$ 88 for Read and Write access to the memory cell. The Bitline 81 and Bitlinebar 82 represent the data lines for Read and Write operations. The word line 85 represents the access line to connect the data lines to memory cell core for reading or writing the contents of the memory core. Here, the inverters INV (83 and 84) are realized by multiple quantum channel SWS-FETs $T_{SWS3}$ 85 and $T_{SWS4}$ 86 as shown in FIG. 12. Two access transistors $T_{A3}$ 87 and $T_{A4}$ 88 are shown. Points q 89 and qbar 90 represents the inputs to inverters INV1 83 and INV2 84. $T_{A3}$ 87 and $T_{A4}$ 88 are the access transistors controlled by wordline 85. The access transistors could be implemented with a single transistor, for example n-Channel Metal Oxide Semiconductor transistor (NMOS) or p-Channel Metal Oxide Semiconductor transistor (PMOS) or combination of transistors. These transistors are turned ON or OFF with wordline, an appropriate voltage level on the gate of the access transistors turn the access transistors ON. When the access transistors ($T_{A3}$ 87 and $T_{A4}$ 88) are ON bitline 81 and Bitline-bar 82 are connected to q 89 and qbar 90. Bitline 81 and bitline-bar 82 represent the data lines for Read and Write operations. During the Read operation, the wordline 85 turns the access transistors ($T_{A3}$ 87 and $T_{A4}$ 88) ON and inverters INV1 83 and INV2 84 charge or discharge bitline 81 ad bitline-bar 82. The charging or discharging or bitline 81 or bitline-bar 82 is sensed by sense circuits (not shown in FIG. 11) and state of the INV1 83 and INV2 84 is detected. In Write operation, the bitline 81 and bitline-bar 82 are charged high or low depending on the state to be programmed, the wordline 85 issues a signal to turn on the access transistors ($T_{A3}$ 87 and $T_{A4}$ 88). Once the access transistors $T_{A3}$ 87 and $T_{A4}$ 88 are ON bitline 81 and bitline bar 82 are connected to q 89 and qbar 90 respectively, driving the input levels of the INV1 83 and INV2 84 to the voltage levels corresponding to the state to be programmed into the memory cell formed by INV1 83 and INV2 84.

FIG. 12 Circuit schematic of a 2-bit SRAM cell 90 using two 4-channel SWS-FETs ($T_{SWS3}$ 85 and $T_{SWS4}$ 86), each is shown with four quantum well channels. Each SWS-FET is shown with four sources (S1, S2, S3, S4). The four sources (S1 91, 92, 93, S4 94 for $T_{SWS3}$ 85 and S1 95, 96, 97, S4 98 for $T_{SWS4}$ 86) are connected to different voltage levels (shown as Vcc, 0.66Vcc, 0.33Vcc, and GND). Four drains are interconnected or shorted together. This configuration effectively delivers a four level inverter as per the logic in FIG. 8b. Hence each SWS-FET in FIG. 12 acts as a four level inverter. Two access transistors ($T_{A5}$ 101 and $T_{A6}$ 102) are also shown which connect the two gates (103 for $T_{SWS3}$ 85 and 104 $T_{SWS4}$ 86) of SWS-FETs to Bitline 105 and Bitline-bar 106. Also the Input1 (gate 103 of Tsws3 85) is connected to the drain 100 of Tsws4 86 and the Input2 (gate 104 of Tsws4 86) is connected to the drain 99 of Tsws3 85. Hence the two inverters represented by the two SWS-FETs, are connected in back to back. This back to back connection creates a positive feedback loop. This feedback loop has the ability to retain its voltage levels and act as a four level (or two binary bit) memory cell. In FIG. 12, the gates of two access transistors are connected to the Wordline 107. When wordline 107 is raise to the appropriate voltage level, the access transistors $T_{A5}$ 101 and $T_{A6}$ 102 turn ON. As $T_{A5}$ 101 and $T_{A6}$ 102 turn ON bitline 105 is connected to Input1 and bitline-Bar 106 is connected to Input2. This configuration, where bitline 105 and bitline-bar 106 are connected to Input1 and Input2, is used for Read and Write operation. During Read operation bitline and bitline bar are charged or discharged by the Input1 and Input2 nodes. This creates a potential difference between bitline 105 and bitline-bar 106. This potential difference is sensed by sense amplifier (not shown in FIG. 12) and state of the memory cell is sensed. In the Write operation, bitline and bitline bar are pre-charged to appropriate voltage levels and then Wordline 107 is charged to turn on $T_{A5}$ 101 and $T_{A6}$ 102, connecting bitline 105 and bitline-bar 106 to Input1 and Input2. Input1 and Input2 are switched by bitline 105 and bitline-bar 106 to the "to be programmed" levels. Thereafter the Wordline 107 is discharged to turn $T_{A5}$ 101 and $T_{A6}$ 102 OFF. This completes the Write operation for the memory cell.

In one embodiment, the access transistors $T_{A5}$ 101 and $T_{A6}$ 102 shown in FIG. 12 are envisioned to be a SWS-FET device. In FIG. 12 the access transistors could be CMOS technology based NMOS, PMOS or combination of thereof. Also SWS-FET could be used as access transistor. In such embodiment each access transistor is replace by an SWS-FET. In another embodiment, a single SWS-FET transistor replaces the two access transistors. Effectively, two channels of a SWS-FET replace the access transistors $T_{A5}$ 101 and $T_{A6}$ 102.

Figure 13:
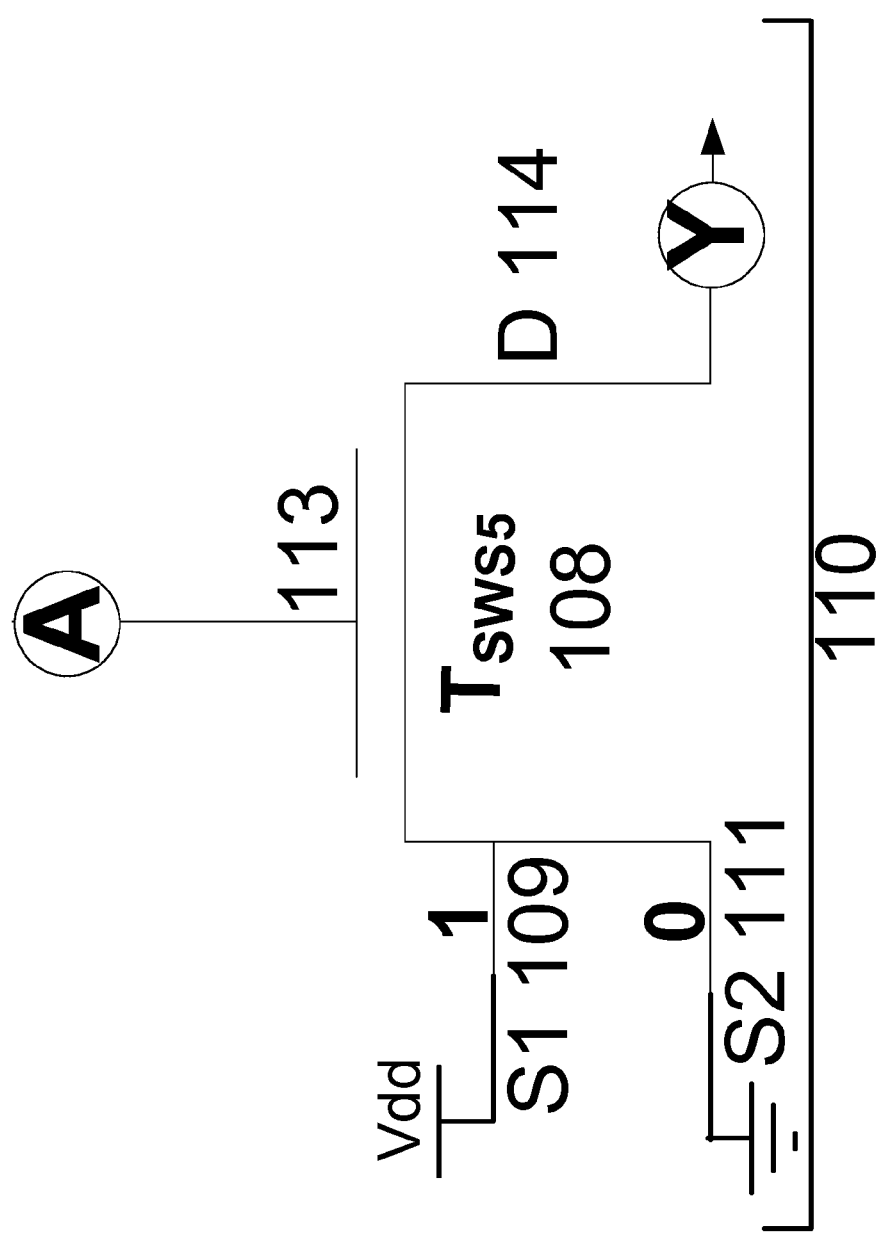
FIG. 13 A 2-channel SWS-FET based single bit, 1-T (transistor) SRAM cell.

FIG. 13 A 2-channel SWS-FET ($T_{SWS5}$) 108 based single-bit, 1-T (transistor) SRAM cell 110. The SWS-FET used here could have two or more channels (only two channels are shown). The two sources S1 109 and S2 111 are connected to Vdd and Gnd respectively and the drains of the two channels are shorted together to give a single drain D 112. The gate 113 voltage (A) controls the channel selection. At a gate voltage (high-level) when upper channel is ON and lower channels is OFF, D 114 connects to S1 109 (Vdd) and at the gate voltage (low-level) when upper channel is OFF and lower channel is ON, the drain D 114 is connected to S2 111 (Gnd). This would make the drain voltage level at "Y" to be the same as the gate voltage level at "A". In other words, drain is high when the gate is high and drain is low when the gate is low. This makes the single SWS-FET 108 in FIG. 13 act as a buffer (a cell with output level same as the input level). This buffer is a building block for designing single transistor SRAM cell 110 using one SWS-FET 108.

Figure 14:
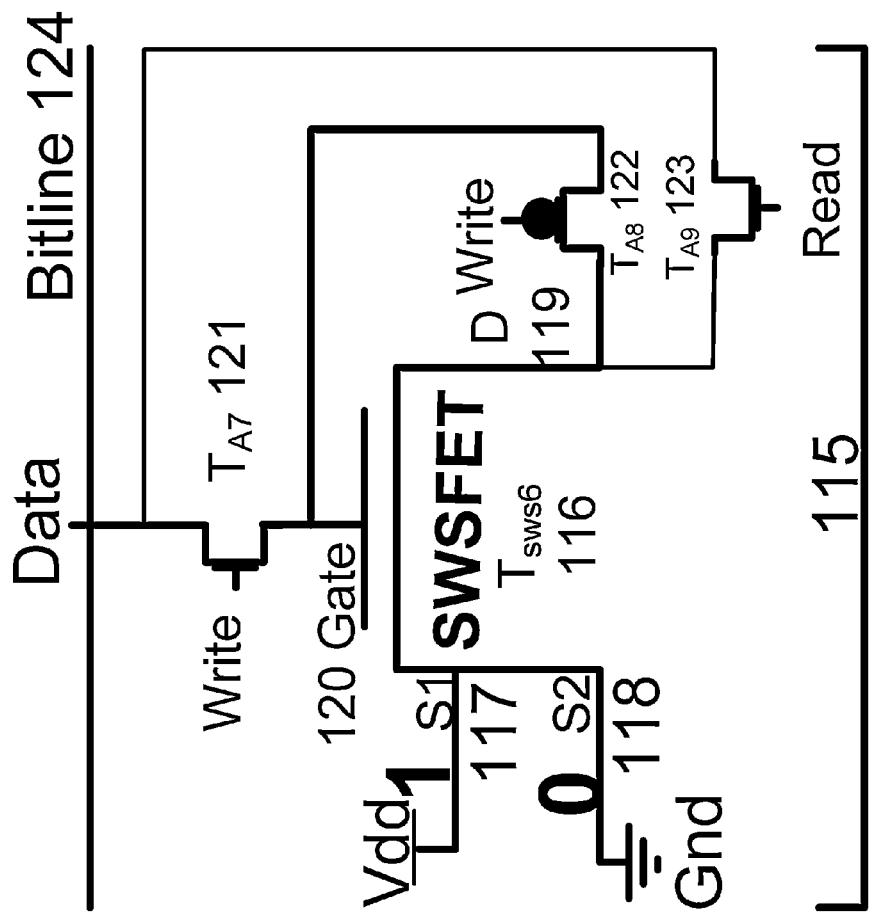
FIG. 14 A 2-channel SWSFET based single bit, 1-T SRAM cell with two conventional access transistors.

FIG. 14 uses the SWS-FET based buffer (shown in FIG. 13) as a building block to create a single-transistor-buffer based memory cell 115. In FIG. 14 $Tsws_6$ 116 is the SWS-FET with two (or more channels) the upper most channel has the source S1 117 connected to Vdd and lower most channel with the source S2 118 connected to Gnd. The two corresponding drains are shorted together creating a single drain D 119. The voltage (A) at gate 120 controls the channel selection. At a gate voltage (high-level) when upper channel is ON and lower channels is OFF, D 119 connects to S1 117 (Vdd) and at the gate voltage (low-level) when upper channel is OFF and lower channel is ON, the drain D 119 is connected to S2 118 (Gnd). This would make the drain voltage level at D 119 to be the same as the gate voltage level at "gate". In other words, drain is high when the gate is high and drain is low when the gate is low. $T_{A7}$ 121 and $T_{A8}$ 122 are the two Write access transistors. Both of these access transistors are controlled by the "Write" signal. When $T_{A7}$ 121 is ON, $T_{A8}$ 122 is OFF and when $T_{A7}$ 121 is OFF $T_{A8}$ 122 is ON. This means that at a given time gate of $T_{sws6}$ 116 is connected either to drain D 119 of $T_{sws6}$ 116 or Data. FET $T_{A9}$ 123 is the Read access transistor when Read is enabled $T_{A9}$ 123 turns ON, connecting drain D 119 to the "Data" via bitline 124. The access transistors $T_{A7}$ 121, $T_{A8}$ 122 and $T_{A9}$ 123 could be replaced with SWS-FET transistors. In one such embodiment, $T_{A7}$ 121 and $T_{A8}$ 122 could be replaced by one SWS-FET with two or more channels. And $T_{A9}$ 123 could be a separate SWS-FET transistor. In another embodiment, $T_{A7}$ 121, $T_{A8}$ 122 and $T_{A9}$ 123 could be replaced by a single SWS-FET with three or more channels. In such a case the Read and Write signals could be represented by a single signal with more than two possible levels. In FIG. 14, when the Write signal is enabled (high in this Figure) $T_{A7}$ 121 is ON and $T_{A8}$ 122 is OFF. Read signal is kept OFF during this time in this embodiment. The Data connects to gate of SWS-FET via $T_{A7}$ 121 and programs the $T_{sws6}$ 116 to the "to be programmed" Data level. After certain duration Write signal is disabled (low here), turning $T_{A7}$ 121 OFF and $T_{A8}$ 122 ON. This disconnects the gate from Data and connects gate to the Drain D 119. Drain 119 and gate 120 goes into positive feedback loop with the ability to retain the programmed state. For read operation, Read signal is enabled and $T_{A9}$ 123 turns ON, connecting drain D 119 directly to Data. Hence drain changes the voltage levels of Data which can be sensed by the sense Amp (no shown in FIG. 14) to read the state of the memory cell. In another embodiment, the "Data" line could be separated into two different lines, one representing the Write data whiles the other representing the Read data line.

Figure 15:
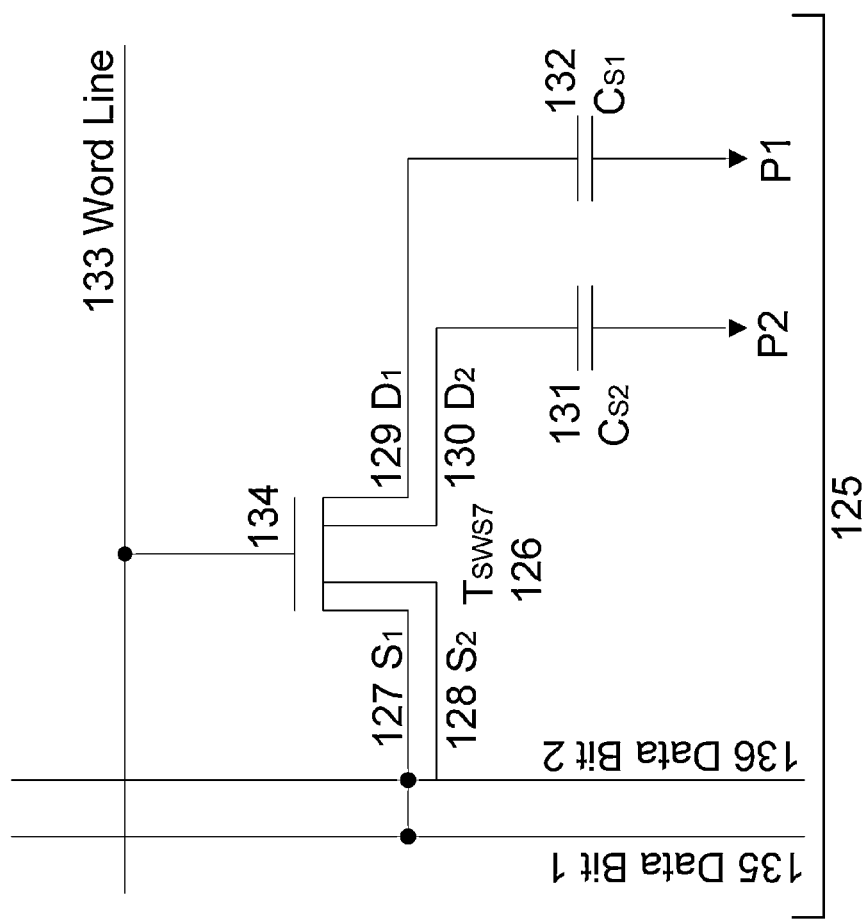
FIG. 15 A two-bit 1-T 2-channel SWS-FET) DRAM cell using two capacitors.

FIG. 15 A 2-bit 1-T 2-channel SWS-FET ($T_{SWS7}$) DRAM cell 125 using two capacitors. SWS-FET ($T_{SWS7}$ 126) is shown with two sources S1 127 and S2 128 and two drains D1 129 and D2 130. It acts as an access transistor which connects storage capacitors Cs1 131 and Cs2 132. This access happens when Word line 133, connected to the gate 134 of $T_{SWS7}$ 126, selects either lower channel (S2 128 and D2 130) or upper channel (S1 127 and D1 129) depending on the magnitude of the Wordline 133 voltage level. In the FIG. 15, D2 130 is connected to capacitors Cs2 132 and D1 129 is connected to Cs1 131. S1 127 and S2 128 are connected to Data Bit 1 135 and Data Bit 2 136, respectively. Thus, Wordline 133 acts an access control signal. When the Wordline 133 has the appropriate level, SWS-FET channels are turned ON, this connects Cs1 132 and Cs2 131 to Data lines (135 and 136). Hence programming the capacitors to the data levels. Each capacitor stores '0' and '1'. Thus, two capacitors here store at least two binary bits of information simultaneously.

Figure 16:
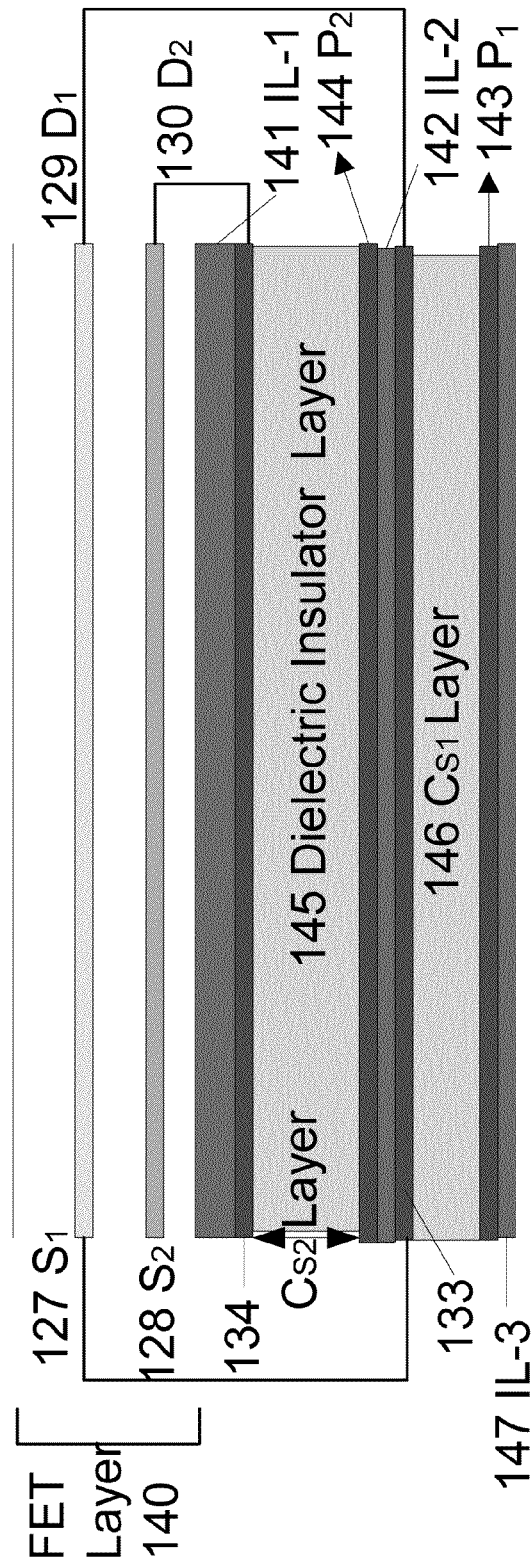
FIG. 16. The topology of the SWS-FET and two stacked capacitors.

FIG. 16 gives the topology of 2-bit DRAM cell with the two capacitors and FET layers stacked vertically. The capacitor layers are separated from FET layer 140 by an isolation layer (IL-1 141) to preserve the stored data. The FET layer 140 comprises of two channels with drain D1 129 and drain D2 130, sources S1 127 and S2 128. The capacitor Cs1 132 electrode 133 is connected to D1 129. The capacitor Cs2 131 electrode 134 is connected to D2 130. The capacitors are separated by isolation layer IL-2 142. The other electrode of Cs1 132 is shown as $P_1$ 143. The other electrode of Cs2 131 is shown as $P_2$ 144. The dielectric insulator layer of Cs2 and Cs1 are shown as 145 and 146, respectively. $P_1$ 143 of Cs1 is isolated by IL-3 layer 147. Various embodiments of this capacitors and SWS-FET are envisioned.

In one embodiment, the capacitors are under the SWS-FET but are not stacked. They are implemented using same dielectric insulator layer (like 145). However, the top electrodes are separated. Their bottom electrodes shown as $P_1$ and $P_2$ could be common. The top electrode area determines their respective values.

Figure 17:
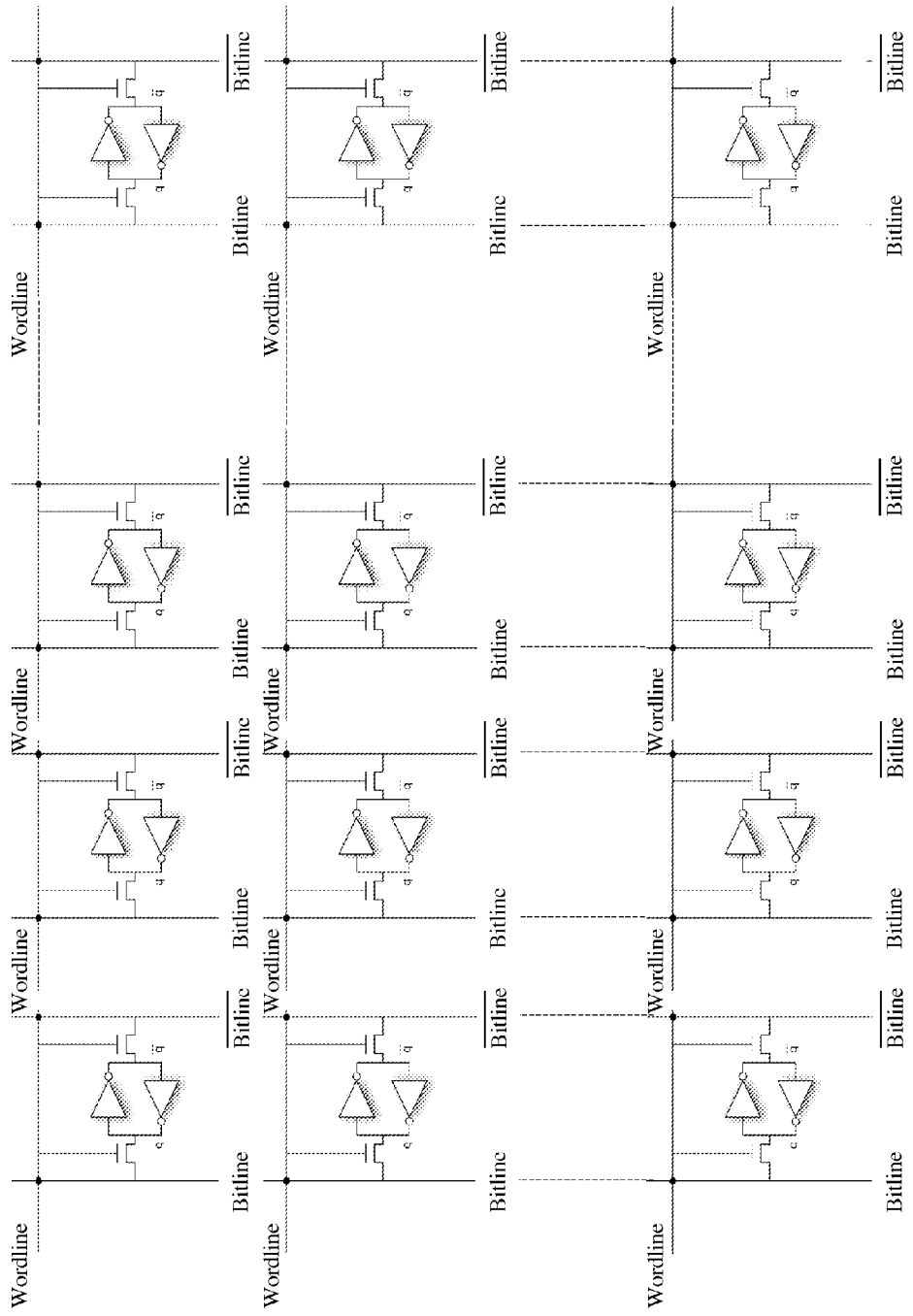
FIG. 17. A SWS-FET based SRAM block for use in a semiconductor chip.

FIG. 17. A SWS-FET based SRAM block for use in a semiconductor chip. FIG. 17 shows the memory array designed using SWS-FET based memory cells. The data lines (bit line and bit line bar) could carry and binary or quaternary level signals. Also the access line (Word line) could be generated from an encoder or decoder block. For Write operation the data lines could be driven by some other design blocks and for Read operation, the data lines could act as an input to some Sense blocks which in-turns process the data signal in analog or digital format.

Figure 18:
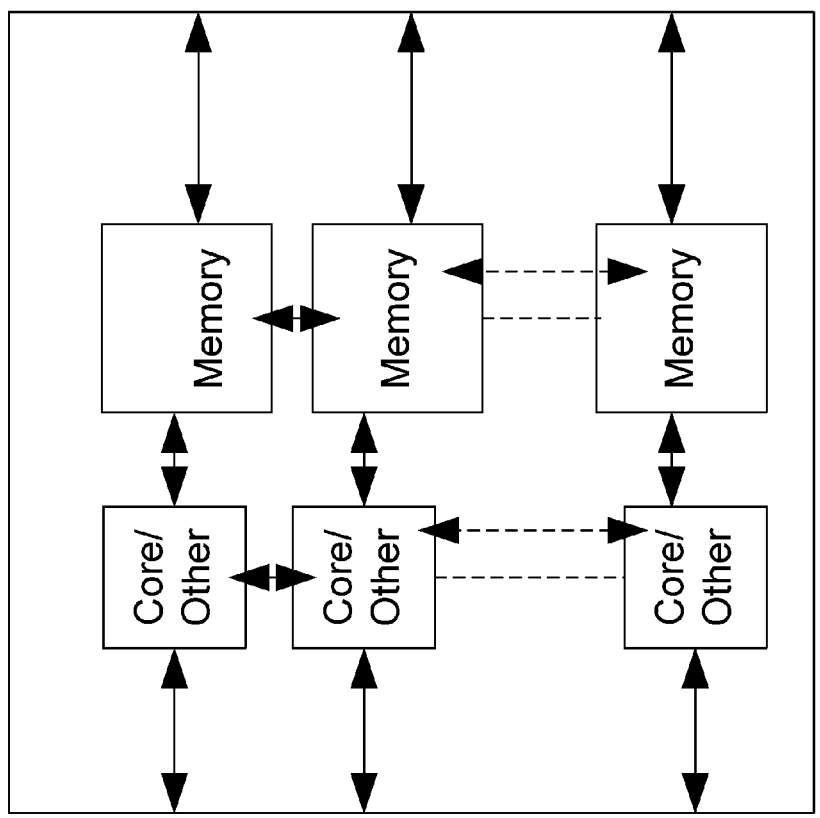
FIG. 18. System design using SWS-FET based memory with other process blocks.

FIG. 18. System design using SWS-FET based memory with other process blocks. FIG. 18 gives the block diagram of a system using SWS-FET based memory block with other logic and arithmetic processing blocks. The memory blocks could be connected to other memory blocks or processing blocks in any arbitrary fashion. Also the memory block(s) or the other procession block(s) could be connected to the system (chip) input(s) or output(s) in arbitrary fashion.

It should be appreciated that various logic gates can be implemented using multiple quantum well channel SWS-FET devices. This multi-valued logic such as quaternary logic results in lower FET count for a given circuit functionality. Additionally, D flip-flops (DFF), half and full-adders, multiplexers, and other logic blocks may be designed using this invention.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the scope thereof. Therefore, it is intended that the invention not be limited to the particular embodiment disclosed as the best mode contemplated for carrying out this invention, but that the invention will include all embodiments falling within the scope of the appended claims. Moreover, unless specifically stated any use of the terms first, second, etc. do not denote any order or importance, but rather the terms first, second, etc. are used to distinguish one element from another.

We claim:

1. A 1-bit Static Random Access Memory (SRAM) cell, comprising:
    two Spatial Wavefunction Switched (SWS) field-effect transistors (FETs),
    wherein said SWS-FETs comprise of at least two quantum well channels with appropriate barrier layers separating quantum wells, gate insulator layer, and gate contact layer, realized on appropriate substrate with buffer layers,
    said quantum well channels comprising of at least two sources and one drain,
    said sources are connected to two voltage sources with different magnitudes,
    the gate of first SWS-FET is connected to the drain of second SWS-FET,
    the gate of second SWS-FET is connected to the drain of first SWS-FET,
    the gates of said two SWS-FETs connected to one end of channel of two access transistors,
    the said access transistors are conventional FETs,
    the other end of channel of conventional access FET is connected to Bitline and Bitline-Bar,
    the gates of said access transistors are connected to Wordline,
    said wordline access the stored bit depending on the voltage level applied to it.

2. The SWS-FET structure of claim 1, where quantum wells and barriers are comprised of InGaAs—InAlAs.

3. A 2-bit Static Random Access Memory (SRAM) cell, comprising:
    two Spatial Wavefunction Switched (SWS) FETs,
    wherein said SWS-FETs comprise of at least four quantum well channels with appropriate barrier layers separating quantum wells, gate insulator layer, and gate contact layer, realized on appropriate substrate with buffer layers,
    said quantum well channels comprising of at least four sources and one drain,
    said sources are connected to four voltage sources with different magnitudes,
    the gate of first SWS-FET is connected to the drain of second SWS-FET,
    the gate of second SWS-FET is connected to the drain of first SWS-FET,
    the gates of said two SWS-FETs connected to one end of channel of two access transistors,
    the said access transistors are conventional FETs,
    the other end of channel of conventional access FET is connected to Bitline and Bitline-Bar,
    the gates of said access transistors are connected to Wordline,
    said wordline access the stored bit depending on the voltage level applied to it.

4. The 2-bit Static Random Access Memory (SRAM) cell of claim 3, where two Spatial Wavefunction Switched (SWS) FETs are comprised of InGaAs—InAlAs.

5. A 2-bit Dynamic Access Memory (DRAM) cell comprising one Spatial Wavefunction Switched (SWS) FET and two storage capacitors,
    wherein said SWS-FETs comprise of at least two quantum well channels with appropriate barrier layers separating quantum wells, gate insulator layer, and gate contact layer, realized on appropriate substrate with buffer layers,
    said quantum well channels comprising of at least two sources and two drains,
    said drains are connected to one electrode of the two storage capacitors,
    the other plates or electrodes of said storage capacitors are connected to ground or appropriate voltage sources,
    said sources are connected to two Bit lines,
    said bit lines are used to Read and Write data stored in the capacitors,
    the gate of said SWS-FET is connected to the Word line,
    said Wordline access the stored bit depending on the voltage level applied to it.

6. The SWS-FET structure of claim 5, where quantum wells and barriers are comprised of InGaAs—InAlAs.

* * * * *